United States Patent
Chi et al.

(10) Patent No.: US 11,990,087 B2
(45) Date of Patent: May 21, 2024

(54) DISPLAY PANEL AND DISPLAY DEVICE

(71) Applicant: Hubei Yangtze Industrial Innovation Center of Advanced Display Co., LTD., Wuhan (CN)

(72) Inventors: Xiao Chi, Shanghai (CN); Lulu Pan, Shanghai (CN); Shaorong Yu, Shanghai (CN)

(73) Assignee: Hubei Yangtze Industrial Innovation Center of Advanced Display Co., LTD., Wuhan (CN)

( * ) Notice: Subject to any disclaimer, the term of this patent is extended or adjusted under 35 U.S.C. 154(b) by 0 days.

(21) Appl. No.: 17/891,842

(22) Filed: Aug. 19, 2022

(65) Prior Publication Data

US 2024/0005855 A1    Jan. 4, 2024

(30) Foreign Application Priority Data

Jun. 30, 2022 (CN) .......................... 202210763323.0

(51) Int. Cl.
*G09G 3/32* (2016.01)
*G09G 3/3225* (2016.01)
*H10K 59/35* (2023.01)
*H10K 59/122* (2023.01)

(52) U.S. Cl.
CPC .......... *G09G 3/3225* (2013.01); *H10K 59/35* (2023.02); *G09G 2300/0452* (2013.01); *G09G 2300/0842* (2013.01); *G09G 2300/0861* (2013.01); *G09G 2320/0686* (2013.01); *H10K 59/122* (2023.02)

(58) Field of Classification Search
CPC ............. H01L 27/3225; H01L 27/3234; H01L 27/3244; H10K 59/35
See application file for complete search history.

(56) References Cited

U.S. PATENT DOCUMENTS

2023/0096260 A1* 3/2023 Zhang ................... G02F 1/1333
257/40

FOREIGN PATENT DOCUMENTS

CN   112038373 A  *  8/2020  ............. H10K 59/00
CN   113178163 A      7/2021

* cited by examiner

*Primary Examiner* — Yuzhen Shen
(74) *Attorney, Agent, or Firm* — Anova Law Group, PLLC

(57) ABSTRACT

A display panel includes a first display area, a second display area, and a transition display area there-between. The first display area includes a plurality of first sub-display areas, the second display area includes a plurality of second sub-display areas, and the transition display area includes at least one sub-transition area. A first sub-display area of the plurality of first sub-display areas, a second sub-display area of the plurality of second sub-display areas and a sub-transition area include a same number of light-emitting elements. Number of pixel circuits for driving each light-emitting element in one of the at least one sub-transition area is greater than number of pixel circuits for driving each light-emitting element in one of the plurality of first sub-display areas and is smaller than number of pixel circuits for driving each light-emitting element in one of the plurality of second sub-display areas.

17 Claims, 38 Drawing Sheets

DISPLAY PANEL AND DISPLAY DEVICE

CROSS-REFERENCE TO RELATED APPLICATION

This application claims priority of Chinese Patent Application No. 202210763323.0, filed on Jun. 30, 2022, the entire contents of which are hereby incorporated by reference.

FIELD OF THE DISCLOSURE

The present disclosure generally relates to the field of display technology and, more particularly, relates to a display panel and a display device.

BACKGROUND

With the development of display technology, Display devices are more and more widely used and have been gradually applied to all aspects of people's work and life. However, in practical applications, display differences between different display areas of some display devices are relatively large, resulting in sudden display changes when a user watches a display screen, and a viewing experience needs to be improved.

BRIEF SUMMARY OF THE DISCLOSURE

One aspect of the present disclosure provides a display panel. The display panel includes a first display area, a second display area, and a transition display area between the first display area and the second display area. The first display area includes a plurality of first sub-display areas, the second display area includes a plurality of second sub-display areas, and the transition display area includes at least one sub-transition area. A first sub-display area of the plurality of first sub-display areas, a second sub-display area of the plurality of second sub-display areas and a sub-transition area include a same number of light-emitting elements. Number of pixel circuits for driving each light-emitting element in one of the at least one sub-transition area is greater than number of pixel circuits for driving each light-emitting element in one of the plurality of first sub-display areas and is smaller than number of pixel circuits for driving each light-emitting element in one of the plurality of second sub-display areas.

Another aspect of the present disclosure provides a display device. The display device includes a display panel. The display panel includes a first display area, a second display area, and a transition display area between the first display area and the second display area. The first display area includes a plurality of first sub-display areas, the second display area includes a plurality of second sub-display areas, and the transition display area includes at least one sub-transition area. A first sub-display area of the plurality of first sub-display areas, a second sub-display area of the plurality of second sub-display areas and a sub-transition area include a same number of light-emitting elements. Number of pixel circuits for driving each light-emitting element in one of the at least one sub-transition area is greater than number of pixel circuits for driving each light-emitting element in one of the plurality of first sub-display areas and is smaller than number of pixel circuits for driving each light-emitting element in one of the plurality of second sub-display areas.

Other aspects of the present disclosure can be understood by a person skilled in the art in light of the description, the claims, and the drawings of the present disclosure.

BRIEF DESCRIPTION OF THE DRAWINGS

To illustrate technical solutions in embodiments of the present disclosure more clearly, the following will briefly introduce accompanying drawings that need to be used in a description of the embodiments. Obviously, the accompanying drawings in the following description are only used for some embodiments of the present disclosure. For a person skilled in the art, other drawings can also be obtained from the accompanying drawings without creative efforts.

Structures, proportions, sizes, and the like illustrated in the accompanying drawings of the specification, in coordination with the content disclosed in the present specification, are only used to help a person skilled in the art to read and understand and are not intended to limit conditions under which the present disclosure can be implemented and therefore have no technical significance. Any modifications to a structure, changes to a proportional relationship or an adjustment on a size should fall within the scope of the technical content disclosed by the present disclosure without affecting effects and objectives that can be achieved by the present disclosure.

DETAILED DESCRIPTION

The embodiments of the present disclosure will be described clearly and completely in conjunction with the accompanying drawings in the embodiments of the present disclosure. Obviously, the described embodiments are only part of the embodiments of the present disclosure, rather than all the embodiments. Based on the embodiments of the present disclosure, all other embodiments obtained by a person skilled in the art without creative efforts shall fall within the protection scope of the present disclosure.

To make the above objects, features and advantages of the present disclosure more clearly understood, the present disclosure will be described in further detail below in conjunction with the accompanying drawings and specific embodiments.

As mentioned in the background section, in practical applications, display differences between different display areas of some display devices are relatively large, resulting in sudden display changes when a user watches a display screen. Especially for low-gray-scale display panels, sudden display changes are more serious, and a viewing experience needs to be improved.

At present, when a display device integrates other functions other than display in a display area, a certain area of the display area of the display panel is usually occupied in the display device. To realize that different display areas have same pixel points, only wirings for driving light-emitting elements and spaces of pixel circuits in the display panel can be sacrificed. Therefore, numbers of light-emitting elements driven by one pixel circuit for driving light-emitting elements in different display areas are quite different, resulting in large display differences between the different display areas, causing sudden display changes when a user watches a display screen, and a viewing experience needs to be improved.

Figure 1:
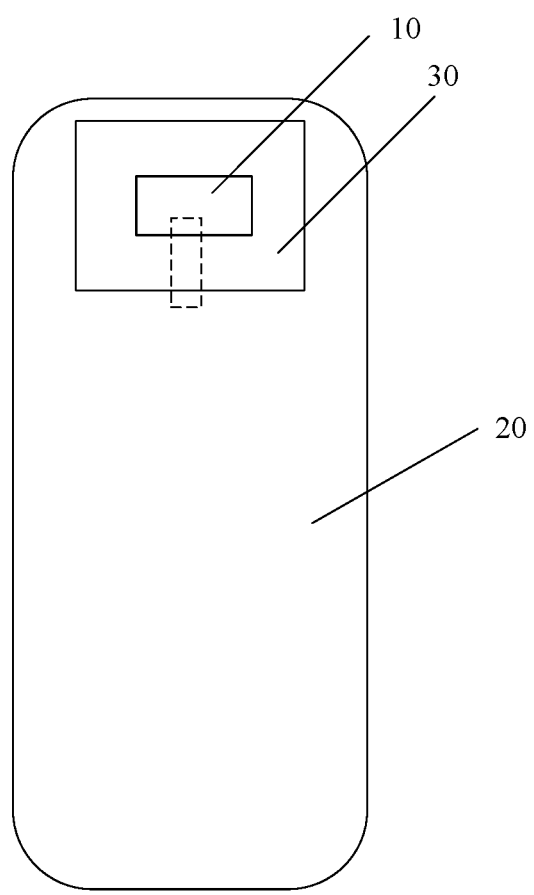
FIG. 1 illustrates a relative position diagram of a first display area, a transition display area, and a second display area in a display panel provided by an embodiment of the present disclosure.

In view of the above, one embodiment of the present disclosure provides a display panel. As shown in FIG. 1, the display panel includes a first display area 10, a second display area 20 and a transition display area 30 between the first display area 10 and the second display area 20. The first display area includes a plurality of first sub-display areas, the second display area includes a plurality of second sub-display areas, and the transition display area includes at least one sub-transition area.

Figure 2:
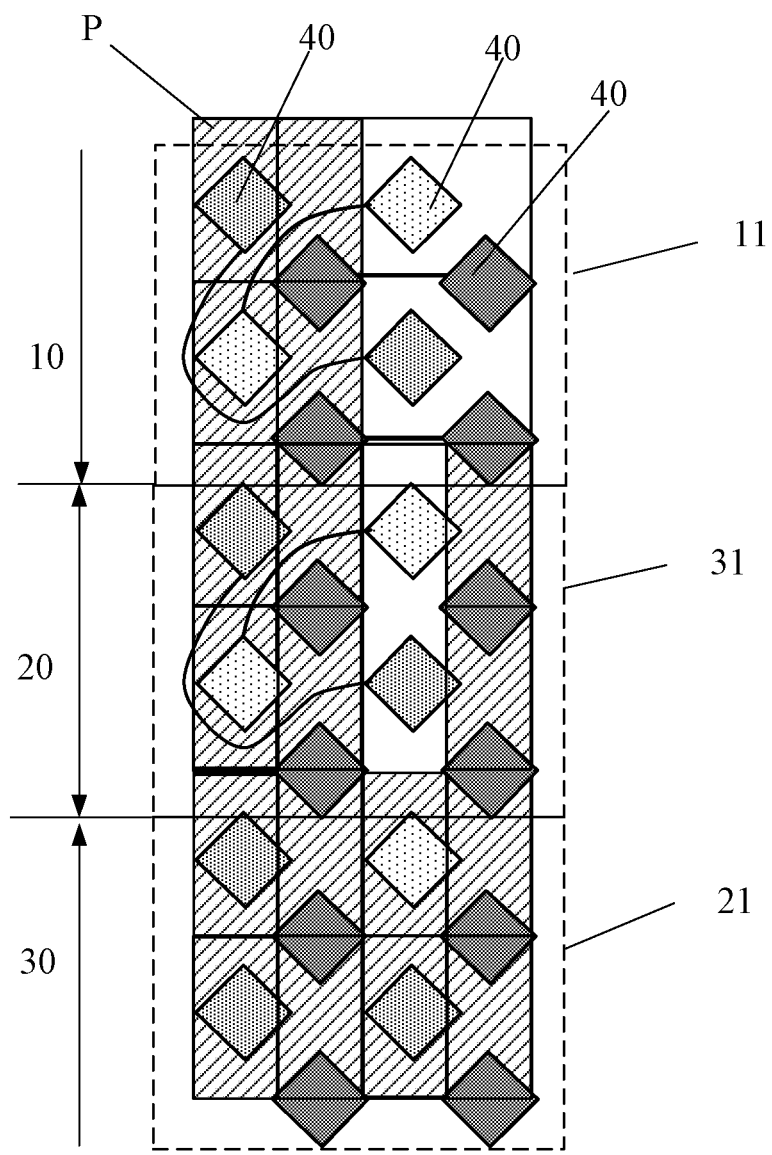
FIG. 2 illustrates a schematic diagram of a first sub-display area, a transition display area, and a second sub-display area in a display panel provided by an embodiment of the present disclosure.

FIG. 2 is a partially enlarged view of a dotted frame area in FIG. 1. A first sub-display area 11, a second sub-display area 21 and a sub-transition display area 31 include a same number of light-emitting elements 40. Number of pixel circuits for driving each light-emitting element 40 in one of the at least one sub-transition area 31 is greater than number of pixel circuits for driving each light-emitting element 40 in one of the plurality of first sub-display area 11 and is smaller than number of pixel circuits for driving each light-emitting element 40 in one of the plurality of second sub-display area 21. Therefore, number of pixel circuits for driving each light-emitting element 40 in one of at least one sub-transition area 31 is between number of pixel circuits for driving each light-emitting element 40 in one of the plurality of first sub-display areas 11 and number of pixel circuits for driving each light-emitting element 40 in one of the plurality of second sub-display areas 21. When the display panel displays a picture, a display effect of the at least sub-transition area 31 is between a display effect of the plurality of first sub-display areas 11 and a display effect of the plurality of second sub-display areas 21. That is, a display effect of the transition display area is between a display effect of the first display area and a display effect of the second display area. The display effect of the transition display area is used to realize a transition between the display effect of the first display area and the display effect of the second display area, to reduce display differences when a user watches a display screen and improve a user experience.

Number of pixel circuits for driving each light-emitting element in one of the at least one sub-transition area is a first number. Number of pixel circuits for driving each light-emitting element in one of the plurality of first sub-display areas is a second number. Number of pixel circuits for driving each light-emitting element in one of the plurality of second sub-display areas is a third number. The first number is greater than the second number and less than the third number.

It should be noted that, the dotted frame area shown in FIG. 1 extends from an area below the first display area to the second display area, which is not limited herein. In other embodiments of the present disclosure, as long as the dotted frame area includes part of the first display area, part of the transition display area and part of the second display area, the dotted frame area shown in FIG. 1 may also extend from an upper area of the first display area to the second display area, or extend from a left area of the first display area to the second display area or extend from a right area of the first display area to the second display area, which is not limited herein.

Based on a sensitivity of a human eye, the transition display area includes a plurality of sub-transition areas. Each of the plurality of sub-transition areas includes at least one row of sub-pixel rows and at least one column of sub-pixel columns, to reduce display differences when a user watches a display screen and improve a user experience. Specifically, in the embodiment, in the plurality of sub-transition areas, number of pixel circuits for driving light-emitting elements in at least part of the plurality of sub-transition areas is greater than number of pixel circuits for driving light-emitting element in one of the plurality of first sub-display areas and is smaller than number of pixel circuits for driving light-emitting elements in one of the plurality of second sub-display areas.

Figure 3:
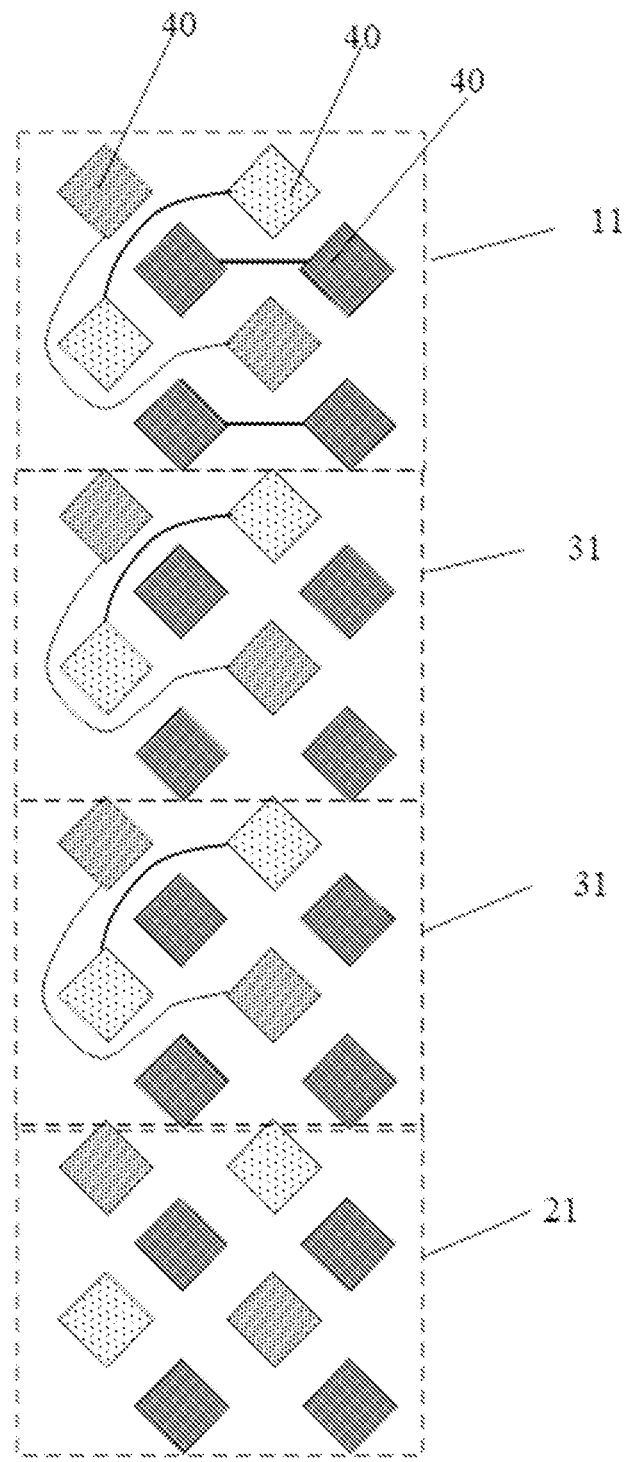
FIG. 3 illustrates a schematic diagram of a first sub-display area, a transition display area, and a second sub-display area in a display panel provided by another embodiment of the present disclosure.

As shown in FIG. 3, in the plurality of sub-transition areas, number of pixel circuits for driving each light-emitting element in each sub-transition area is greater than number of pixel circuits for driving each light-emitting element in one of the plurality of first sub-display areas and is smaller than number of pixel circuits for driving each light-emitting element in one of the plurality of second sub-display areas.

In the plurality of sub-transition areas, number of pixel circuits for driving each light-emitting element in each of the plurality of sub-transition areas is same. As shown in FIG. 3, in the plurality of sub-transition areas, the number of pixel circuits for driving each light-emitting element in each of the plurality of sub-transitions area in each of the plurality of sub-transition areas is a first number. The first number is greater than the second number and less than the third number.

Figure 4:
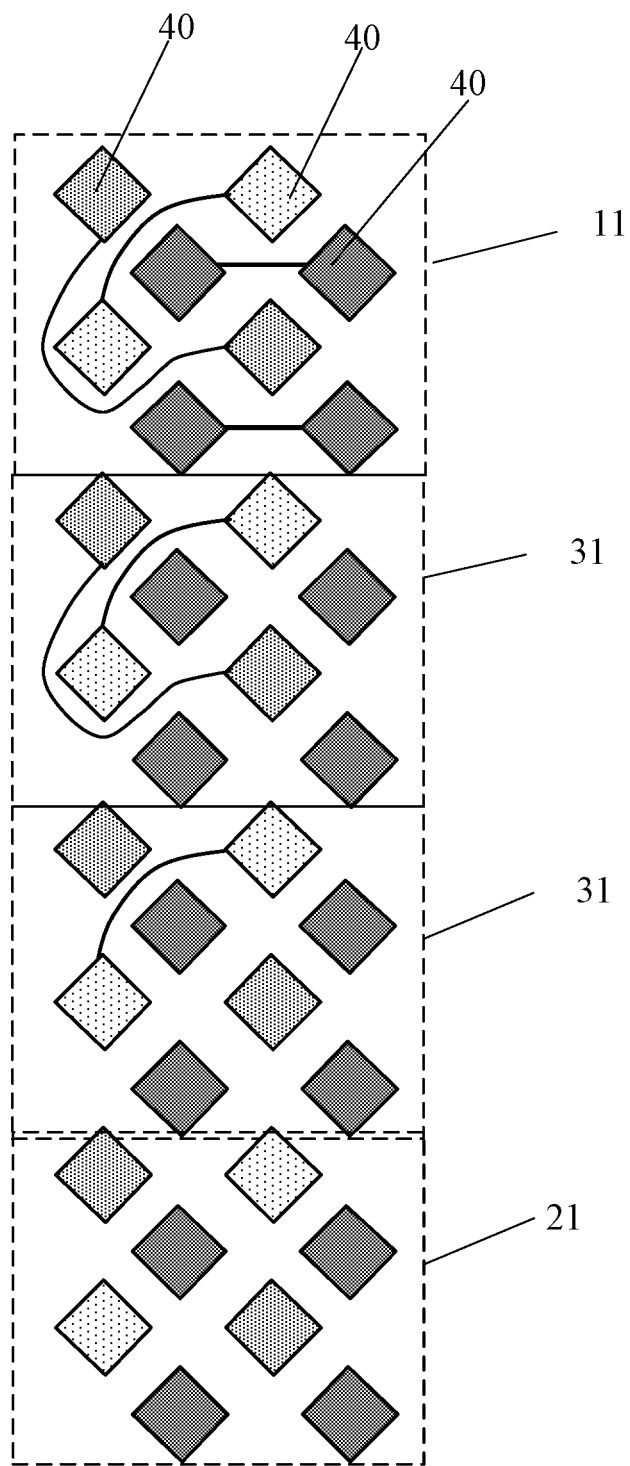
FIG. 4 illustrates a schematic diagram of a first sub-display area, a transition display area, and a second sub-display area in a display panel provided by another embodiment of the present disclosure.

As shown in FIG. 4, in the plurality of sub-transition areas, number of pixel circuits for driving each light-emitting element in each of the plurality of sub-transition areas is not exactly same. As shown in FIG. 4, in the plurality of sub-transition areas, number of pixel circuits for driving each light-emitting element in part of the plurality of sub-transition areas is a first number. Number of pixel circuits for driving each light-emitting element in another part of the plurality of sub-transition areas is a fourth number. The first number is greater than the second number and less than the third number. The fourth number is greater than the second number and less than the third number, but the first number and the fourth number are different.

It should be noted that, the above embodiments are described by taking an example that number of pixel circuits for driving each light-emitting element in each of the plurality of sub-transition areas is greater than number of pixel circuits for driving each light-emitting element in one of the plurality of first sub-display areas and is smaller than number of pixel circuits for driving each light-emitting element in one of the plurality of second sub-display areas.

In other embodiments of the present disclosure, in the plurality of sub-transition areas, number of pixel circuits for driving each light-emitting element in part of the plurality of sub-transition areas is greater than number of pixels circuits for driving each light-emitting element in one of the plurality of first sub-display areas and is smaller than number of pixel circuits for driving each light-emitting element in one of the plurality of second sub-display areas; or number of pixel circuits for driving each light-emitting element in another part of the sub-transition areas is equal to number of pixel circuits for driving each light-emitting elements in one of the plurality of first sub-display areas, or is equal to number of pixel circuits for driving each light-emitting element in one of the plurality of second sub-display areas.

A light-emitting element in the display panel may be an OLED or an LED, which is not limited herein, and depends on a specific situation. The display panel provided by the embodiment of the present disclosure is described below by taking a light-emitting element as an OLED as an example.

Figure 5:
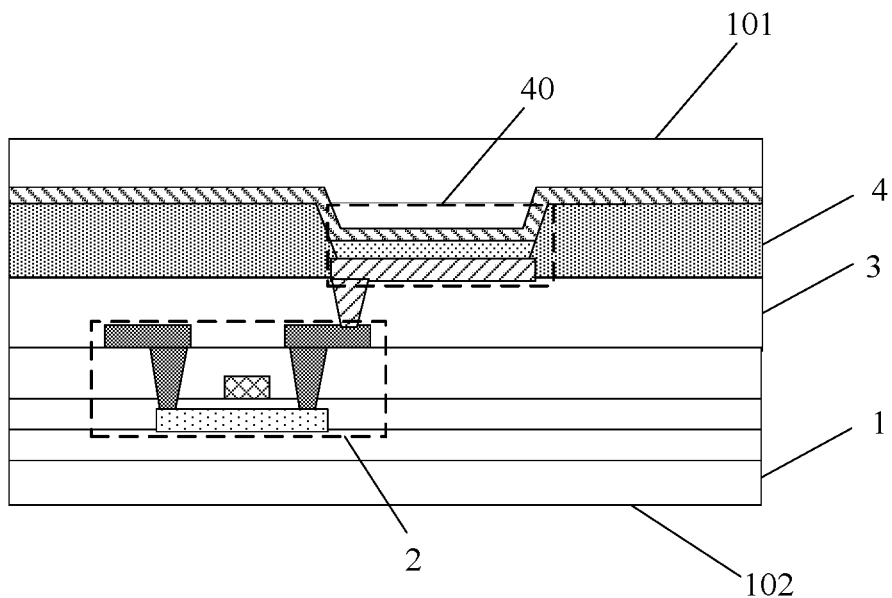
FIG. 5 illustrates a cross-sectional view of a display panel provided by an embodiment of the present disclosure.

As shown in FIG. 5, the display panel includes a first substrate 1, a plurality of pixel circuits on a first side of the first substrate 1, and a plurality of light-emitting elements 40 on a side of the pixel circuits away from the first substrate 1. The pixel circuits include a thin film transistor 2 for controlling a working state of the light-emitting element 40. Specifically, the light-emitting element 40 includes a cathode, an anode, and a light-emitting layer between the cathode and the anode. The anode is electrically connected to a drain of the thin film transistor and works with the cathode to control a light-emitting state of the light-emitting layer under a voltage applied by the thin-film transistor. The display panel may be a top-emission display panel, and the light emitting element 40 emits light toward a side away from the first substrate 1. That is, an upper side of the display panel in FIG. 5 is a display side 101, and a lower side of the display panel in FIG. 5 is a non-display side 102.

As shown in FIG. 5, the display panel further includes a planarization layer 3 covering the thin film transistor 2, and a pixel definition layer 4 on a side of the planarization layer 3 away from the first substrate 1. The pixel definition layer 4 has a plurality of openings corresponding to light-emitting layers in the openings one-to-one.

The plurality of light-emitting elements may include OLEDs of a plurality of colors to realize a display of a color screen by emitting light of different colors from the OLEDs of different colors. For example, the OLEDs of the plurality of colors include red OLEDs, blue OLEDs, and green OLEDs, and the like. It should be noted that, in the embodiment, one OLED corresponds to one sub-pixel.

In another embodiment of the present disclosure, the display panel includes a light-emitting element layer and a color conversion layer. The light-emitting element layer includes a plurality of OLEDs that emit light of a same color. The color conversion layer includes a quantum dot layer for forming different outgoing colors under an excitation of light emitted by the OLEDs that emit light of a same color to achieve a display of a color screen. The OLEDs that emit light of a same color may be blue OLEDs or green OLEDs, which is not limited herein and depends on a specific situation. It should be noted that, in the embodiment, one OLED and a corresponding color conversion layer portion thereof are combined into one light-emitting element corresponding to one sub-pixel.

When the display panel includes light-emitting elements of a plurality of colors, light-emitting elements driven by one pixel circuit may all be light-emitting elements of a same color.

It should be noted that, with the development of light sensing technology, more and more display devices integrate optical sensors to realize light collection, thereby integrating more functions into the display devices, such as image collection functions, fingerprint recognition function, and the like. Correspondingly, in a display panel, a light-transmitting area needs to be set to provide light for a display device integrated with optical sensors.

Figure 6:
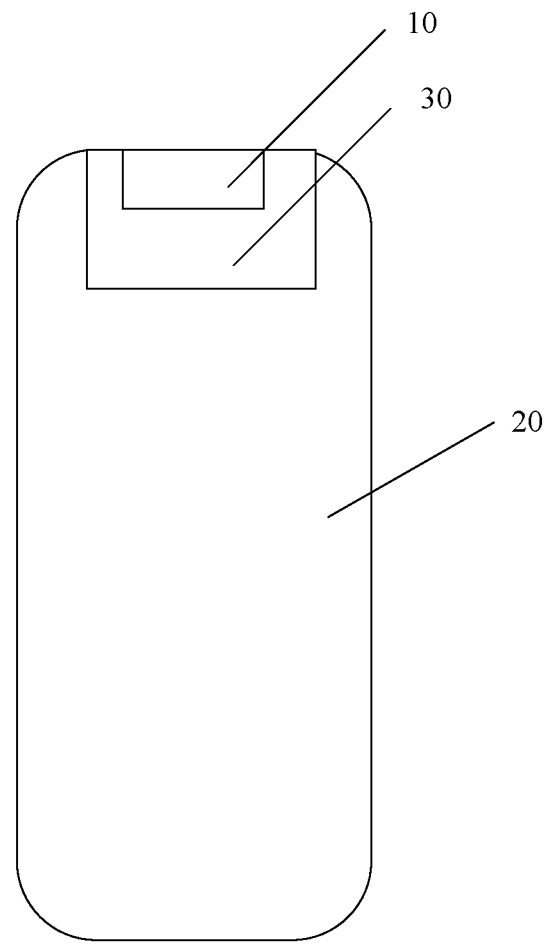
FIG. 6 illustrates a relative position diagram of a first display area, a transition display area, and a second display area in a display panel provided by another embodiment of the present disclosure.

The first display area includes a light-transmitting area. As shown in FIG. 1, the second display area is annularly disposed around the first display area. In another embodiment of the present disclosure, as shown in FIG. 6, the second display area surrounds three sides of the first display area. In other embodiments of the present disclosure, the first display area and the second display area may also adopt other relative positions by using a side-by-side arrangement, which is not limited herein, and depends on a specific situation.

Figure 7:
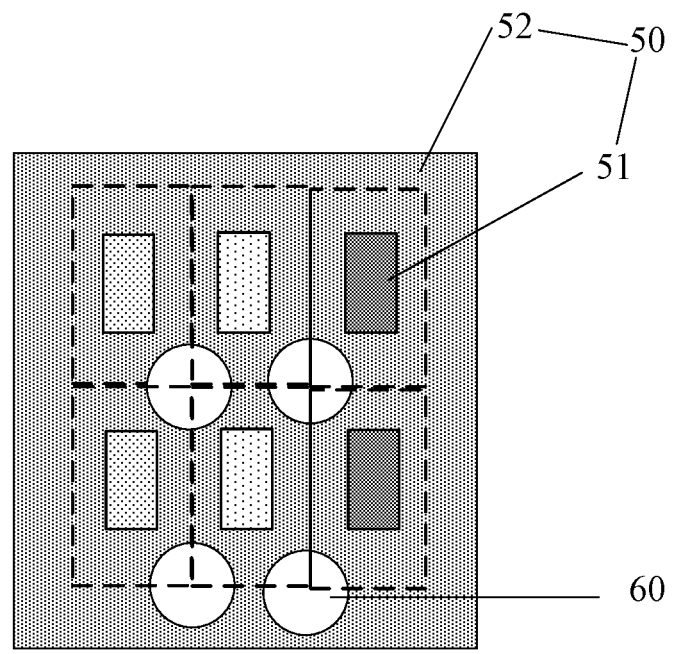
FIG. 7 illustrates a relative position diagram of sub-pixels and a light-transmitting area in a display panel provided by an embodiment of the present disclosure.
Figure 8:
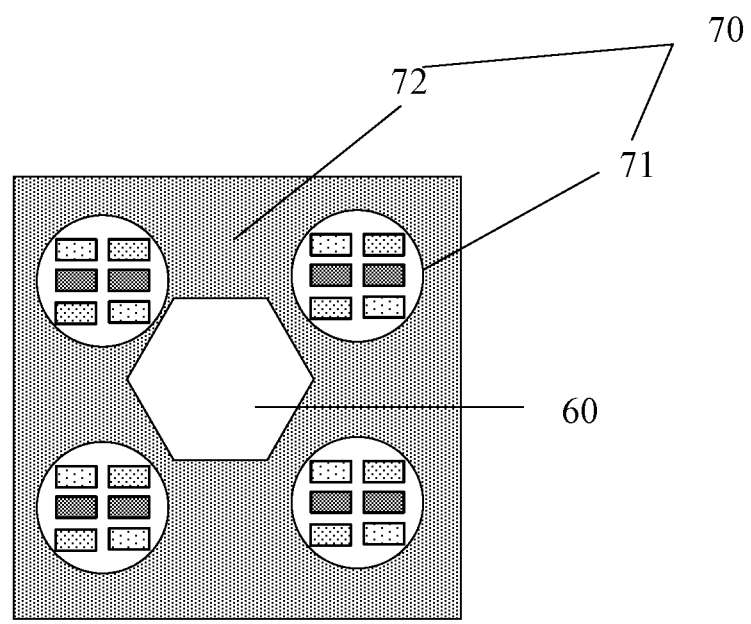
FIG. 8 illustrates a relative position diagram of pixel units and a light-transmitting area in a display panel provided by an embodiment of the present disclosure.

As shown in FIG. 7, the display panel includes a plurality of sub-pixels 50. Each of the plurality of sub-pixel 50 includes an opening area 51 and a non-opening area 52. The light-emitting elements are in opening areas 51 of the plurality of sub-pixels 50. The light-transmitting area is in non-opening areas 52 between adjacent sub-pixels 50. Specifically, the light-transmitting area is composed of light-transmitting holes 60 in the non-opening areas between adjacent sub-pixels 50. In another embodiment, as shown in FIG. 8, the display panel includes a plurality of pixel units 70, and each of the plurality of pixel units 70 includes an opening area 71 and a non-opening area 72. One of the plurality of pixel units 70 may include red light-emitting elements, green light-emitting elements, and blue light-emitting elements. Each light-emitting element is in the opening area 71 of each of the plurality of pixel units 70. The light-transmitting area is in the non-opening area 72 between adjacent pixel units to increase a size of a single light-transmitting hole 60.

The transition display area 30 does not include a light-transmitting area.

The light-emitting elements in the display panel include light-emitting elements of three colors which are the first light-emitting elements, the second light-emitting elements and the third light-emitting elements. In the first sub-display area, one of the pixel circuits is electrically connected to at least two light-emitting elements. Specifically, in the first sub-display area, one pixel circuit is electrically connected to at least two light-emitting elements of a same color, to leave a relatively large space for setting the light-transmitting area. In the second sub-display area, one of the pixel circuits is electrically connected to one light-emitting element, so that each light-emitting element in the second sub-display area can be displayed independently, thereby improving a display resolution of the display panel. In the sub-transition area, each of part of the pixel circuits is electrically connected to at least two light-emitting elements, and each of the remaining pixel circuits is electrically connected to one light-emitting element. Specifically, in the sub-transition area, each of part of pixel circuits is electrically connected to at least two light-emitting elements of a same color, and each of another part of pixel circuits is electrically connected to one light-emitting element of a same color. Therefore, number of pixel circuits for driving each light-emitting element in one of the plurality of sub-transition areas is greater than number of pixel circuits for driving each light-emitting element in one of the plurality of first sub-display areas and is smaller than number of pixel circuits for driving each light-emitting element in one of the plurality of second sub-display areas. Therefore, number of pixel circuits for driving each light-emitting element in one of the plurality of sub-transition areas is between number of pixel circuits for driving each light-emitting element in one of the plurality of first sub-display areas and number of pixel circuits for driving each of the light-emitting elements in one of the plurality of second sub-display areas. Therefore, when the display panel displays a picture, a display effect of the plurality of sub-transition area is between a display effect of the plurality of first sub-display area and a display effect of the plurality of second sub-display area. That is, a display effect of the transition display area is between a display effect of the first display area and a display effect of the second display area. The display effect of the transition display area is used to realize a transition between the display effect of the first display area and the display effect of the second display area, thereby reducing a display difference when a user watches a display screen and improving a user experience.

Figure 9:
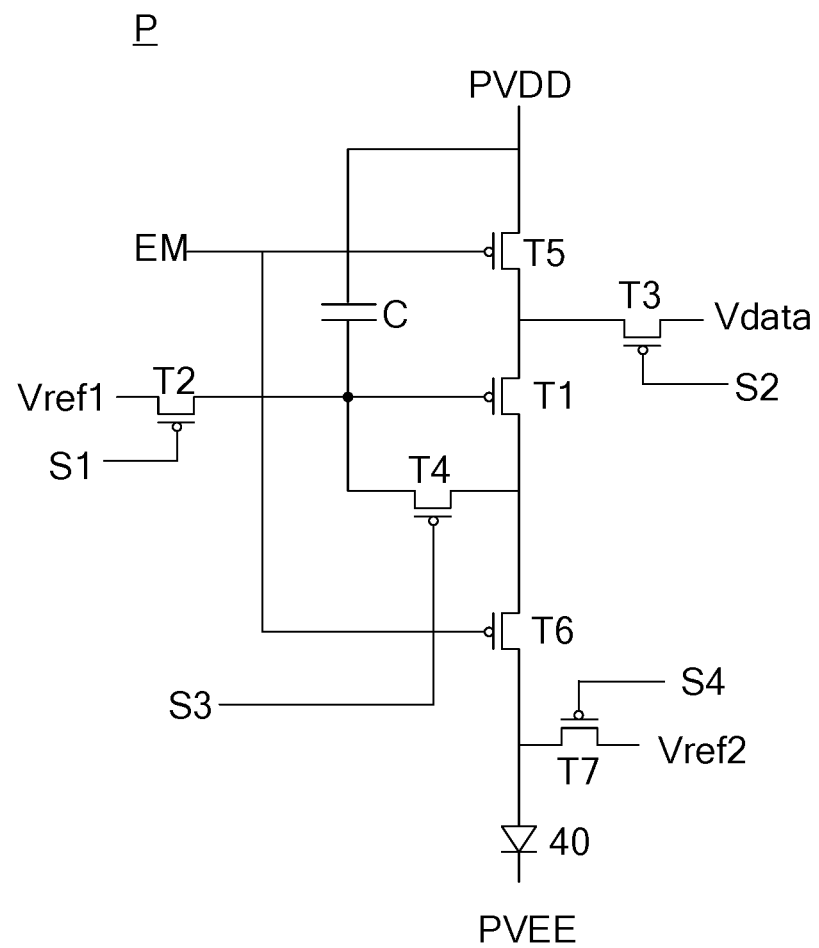
FIG. 9 illustrates a circuit structure diagram of one pixel circuit driving one light-emitting element provided by an embodiment of the present disclosure.
Figure 10:
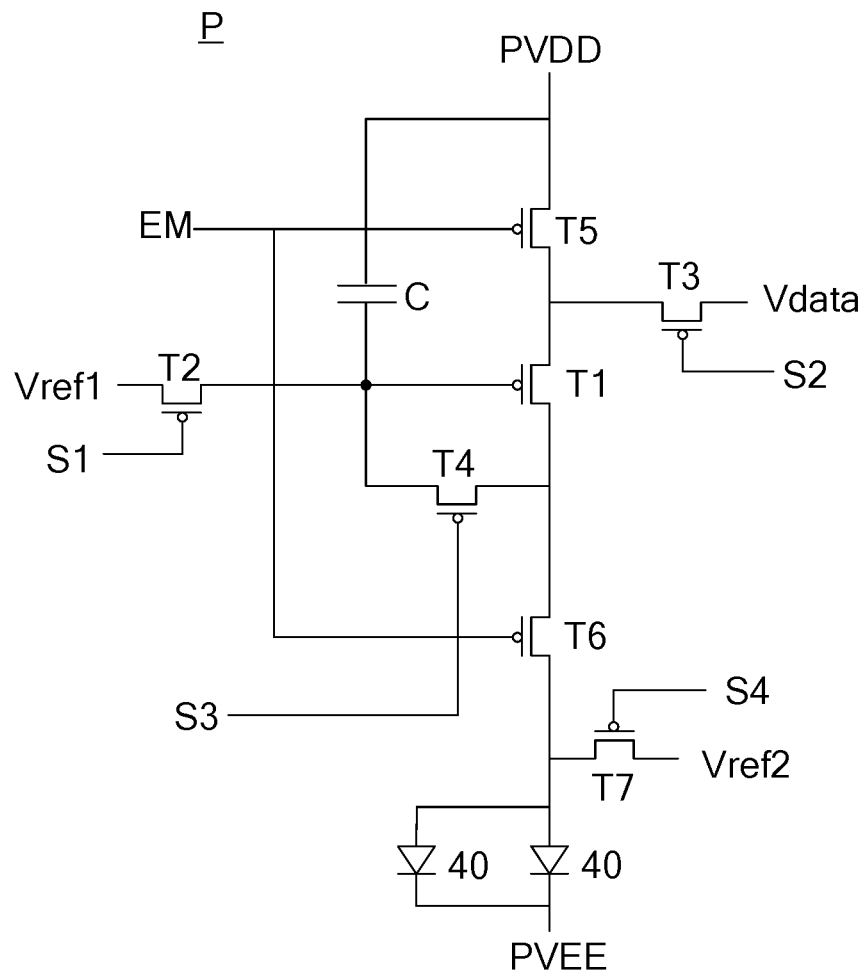
FIG. 10 illustrates a circuit structure diagram of one pixel circuit driving two light-emitting elements provided by an embodiment of the present disclosure.
Figure 11:
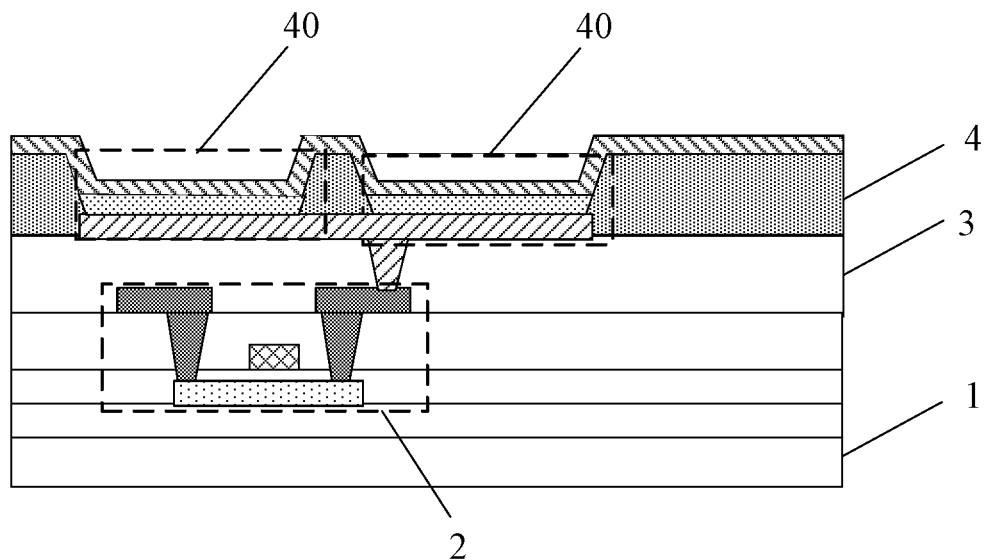
FIG. 11 illustrates a cross-sectional view of a display panel provided by another embodiment of the present disclosure.

Specifically, the pixel circuit can be a 7T1C circuit, that is, a pixel circuit includes seven thin film transistors and one capacitor. FIG. 9 illustrates a schematic diagram of a circuit structure of one pixel circuit P driving one light-emitting element 40, that is, a schematic diagram of a circuit structure in which one pixel circuit P is electrically connected to one light-emitting element 40. FIG. 5 illustrates a partial cross-sectional view of one pixel circuit P driving one light-emitting element 40. FIG. 10 illustrates a schematic diagram of a circuit structure in which one pixel circuit P drives two light-emitting elements 40, that is, a schematic diagram of a circuit structure in which one pixel circuit P is electrically connected to two light-emitting elements 40. FIG. 11 illustrates a partial cross-sectional view of one pixel circuit P driving two light-emitting elements 40.

The light-emitting elements in the display panel include light-emitting elements of three colors which are the first light-emitting elements, the second light-emitting elements and the third light-emitting elements. The sub-transition area includes at least one transition light-emitting element and at least one non-transition light-emitting element. The transition light-emitting elements are selected from one or two types of first light-emitting elements, second light-emitting elements. and third light-emitting elements. The rest light-emitting elements are non-transition light-emitting elements.

An arrangement of the transition light-emitting elements includes that number of transition light-emitting elements in the sub-transition area driven by one pixel circuit is equal to number of transition light-emitting elements in the first sub-display area driven by one pixel circuit and is greater than number of transition light-emitting elements in the second sub-display area driven by one pixel circuit. That is, in the sub-transition area, one of the pixel circuits for driving the transition light-emitting elements is electrically connected to at least two light-emitting elements. Optionally, in the embodiment, an electrical connection manner of a transition light-emitting element in the sub-transition area and a corresponding pixel circuit thereof is same as an electrical connection manner of a transition light-emitting element in the first sub-display area and a corresponding pixel circuit thereof.

An arrangement of the non-transition light-emitting elements includes that number of non-transition light-emitting elements in the sub-transition area driven by one pixel circuit is smaller than number of non-transition light-emitting elements in the first sub-display area driven by one pixel circuit and is equal to number of non-transition light-emitting elements in the second sub-display area driven by one pixel circuit. That is, one of pixel circuits for driving the non-transition light-emitting elements is electrically connected to one light-emitting element. Optionally, in the embodiment, an electrical connection manner of a non-transition light-emitting element in the sub-transition area and a corresponding pixel circuit thereof is same as an electrical connection manner of a non-transition light-emitting element in the second sub-display area and a corresponding pixel circuit thereof.

Numbers of light-emitting elements included in the first sub-display area, the second sub-display area, and the sub-transition area are all eight, which are two blue light-emitting elements, two red light-emitting elements, and four green light-emitting elements. In the first sub-display area, each of pixel circuits for driving red light-emitting elements drives two red light-emitting elements, each of pixel circuits for driving blue light-emitting elements drives two blue light-emitting elements, and each of pixel circuits for driving green light-emitting elements drives two green light-emitting elements to consider both a display resolution and a light transmittance of the display panel. In other embodiments of the present disclosure, in the first sub-display area, one pixel circuit can also drive other numbers of light-emitting elements of a same color, which is not limited herein and depends on a specific situation.

Specifically, as shown in FIG. 2, number of light-emitting elements included in the first sub-display area, the second sub-display area, and the sub-transition area are all eight, which are two blue light-emitting elements, two red light-emitting elements and four green light-emitting element respectively. In the embodiment, in the first sub-display area, each of pixel circuits for driving red light-emitting elements drives two red light-emitting elements, each of pixel circuits for driving blue light-emitting elements drives two blue light-emitting elements, each of pixel circuits for driving green light-emitting elements drives two green light-emitting elements, and a total of four pixel circuits P are required. In the sub-transition area, each of pixel circuits for driving red light-emitting elements drives two red light-emitting elements, each of pixel circuits for driving blue light-emitting elements drives two blue light-emitting elements, each of pixel circuits for driving green light-emitting elements drives one green light-emitting element, and a total of six pixel circuits P are required. In the second sub-display area, each of pixel circuits for driving red light-emitting elements drives one red light-emitting element, each of pixel circuits for driving blue light-emitting elements drives one blue light-emitting element, each of pixel circuits for driving green light-emitting elements drives one green light-emitting element, and a total of eight pixel circuits P are required. It should be noted that, in FIG. 2, light-emitting elements connected by a same connection line are light-emitting elements driven by a same pixel circuit. For ease of illustration, in electrical connection diagrams after FIG. 2, only light-emitting elements and connection lines are illustrated, and pixel circuits are no longer illustrated.

In conjunction with specific embodiments, the display panel provided by the embodiments of the present disclosure will be described below by taking an example that one pixel circuit drives two light-emitting elements of a same color in the first sub-display area, and one pixel circuit drives one light-emitting element of a same color in the second sub-display area.

Specifically, in one embodiment, the first light-emitting elements are blue light-emitting elements, the second light-emitting elements are red light-emitting elements, and the third light-emitting elements are green light-emitting elements.

Optionally, in one embodiment, the transition light-emitting elements are selected from one type of first light-emitting elements, second light-emitting elements, and third light-emitting elements, and the rest light-emitting elements are non-transition light-emitting elements.

Figure 12:
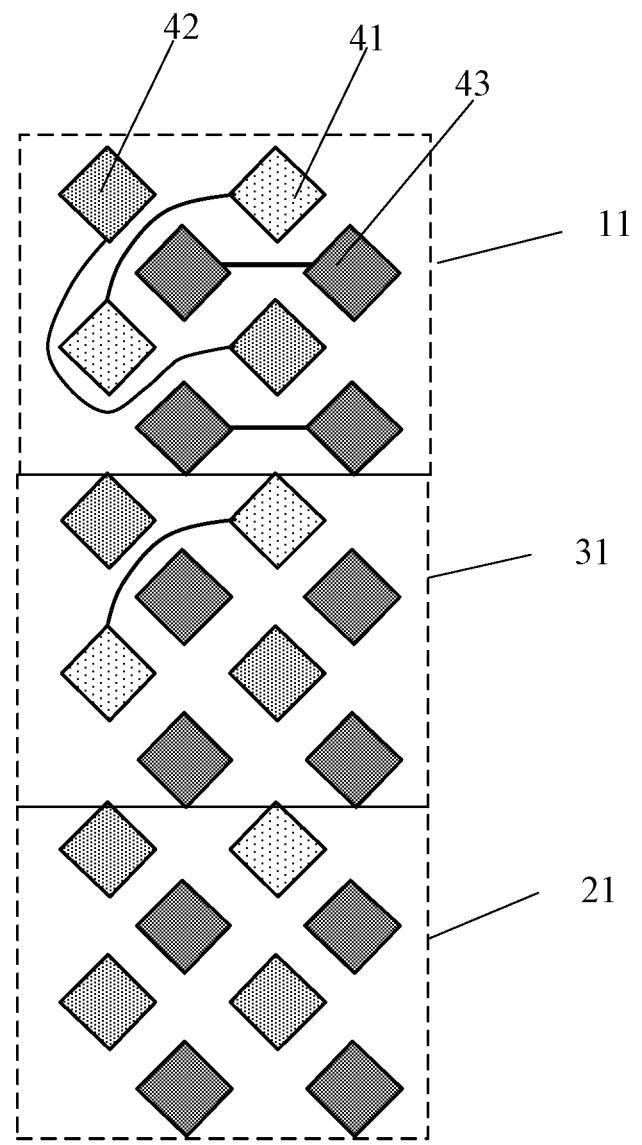
FIG. 12 illustrates a schematic diagram of a first sub-display area, a transition display area, and a second sub-display area in a display panel provided by another embodiment of the present disclosure.

In one embodiment, the transition light-emitting elements are the first light-emitting elements, and the non-transition light-emitting elements are the second light-emitting elements and the third light-emitting elements. As shown in FIG. 12, the blue light-emitting elements 41 are transition light-emitting elements, and the red light-emitting elements 42 and the green light-emitting elements 43 are non-transition light-emitting elements.

As shown in FIG. 12, in the first sub-display area 11, one of pixel circuits electrically connected to the blue light-emitting elements 41 is electrically connected to two blue light-emitting elements 41, one of pixel circuits electrically connected to the red light-emitting elements 42 is electrically connected to two red light-emitting elements 42, and one of pixel circuits electrically connected to the green light-emitting elements 43 is electrically connected to two green light-emitting elements 43.

In the sub-transition area 31, one of pixel circuits electrically connected to the blue light-emitting elements 41 is electrically connected to two blue light-emitting elements 41, one of pixel circuits electrically connected to the red light-emitting elements 42 is electrically connected to one red light-emitting element 42, one of pixel circuits electrically connected to the green light-emitting elements 43 is electrically connected to one green light-emitting element 43.

In the second sub-display area 21, one of pixel circuits electrically connected to the blue light-emitting elements 41 is electrically connected to one blue light-emitting element 41, one of pixel circuits electrically connected to the red light-emitting elements 42 is electrically connected to one red light-emitting element 42, and one of pixel circuits electrically connected to the green light-emitting elements 43 is electrically connected to one green light-emitting element 43.

The light-emitting elements in the first sub-display area in the first display area adopt a "one-drive-a plurality" approach, which reduce number of pixel circuits and improve a light transmittance under a condition that an arrangement density of the light-emitting elements is same or similar, The light-emitting elements in the second sub-display area in the second display area adopts a "one-drive-one" approach, so that a resolution of the second display area is relatively high. However, due to a large difference between a driving relationship between the pixel circuits and a driving relationship between the light-emitting elements in the first display area and the second display area, a difference between the display effect of the first display area and the display effect of the second display area is relatively obvious, so that a boundary is formed between the first display area and the second display area.

A human eye has different degrees of sensitivity to different colors. The human eye is more sensitive to green than red, and less sensitive to blue than red. By setting the blue light-emitting elements as the transition light-emitting elements, on the one hand, in terms of display resolution, the transition light-emitting elements play a transition role between the first display area and the second display area, and at a same time, a sensitivity of the human eye to different display effects between the first display area and the transition display area and a sensitivity of the human eye to different display effects between the transition display area and the second display area are reduced, thereby weakening a display effect difference between the first display area and the second display area.

Figure 13:
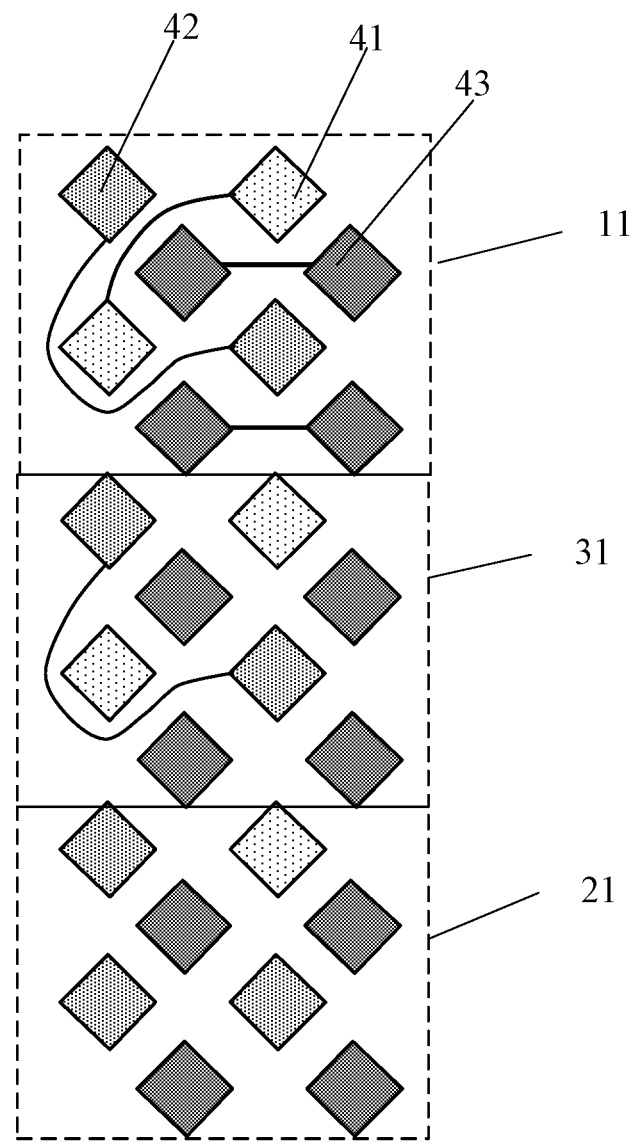
FIG. 13 illustrates a schematic diagram of a first sub-display area, a transition display area, and a second sub-display area in a display panel provided by another embodiment of the present disclosure.

In another embodiment, the transition light-emitting elements are the second light-emitting elements, and the non-transition light-emitting elements are the first light-emitting elements and the third light-emitting elements. As shown in FIG. 13, red light-emitting elements 42 are transition light-emitting elements, and blue light-emitting elements 41 and green light-emitting elements 43 are non-transition light-emitting elements.

As shown in FIG. 13, in the first sub-display area 11, one of pixel circuits electrically connected to the blue light-emitting elements 41 is electrically connected to two blue light-emitting elements 41, one of pixel circuits electrically connected to the red light-emitting elements 42 is electrically connected to two red light-emitting elements 42, and one of pixel circuits electrically connected to the green light-emitting elements 43 is electrically connected to two green light-emitting elements 43.

In the sub-transition area 31, one of pixel circuits electrically connected to the blue light-emitting elements 41 is electrically connected to one blue light-emitting element 41, one of pixel circuits electrically connected to the red light-emitting elements 42 is electrically connected to two red light-emitting elements 42, and one of pixel circuits electrically connected to the green light-emitting elements 43 is electrically connected to one green light-emitting element 43.

In the second sub-display area 21, one of pixel circuits electrically connected to the blue light-emitting elements 41 is electrically connected to one blue light-emitting element 41, one of pixel circuits electrically connected to the red light-emitting elements 42 is electrically connected to one red light-emitting element 42, one of pixel circuits electrically connected to the green light-emitting elements 43 is electrically connected to one green light-emitting element 43.

In another embodiment, the transition light-emitting elements are the third light-emitting elements, and the non-transition light-emitting elements are the first light-emitting elements and the second light-emitting elements. That is, in the embodiment, as shown in FIG. 14, green light-emitting elements 43 are transition light-emitting elements, and blue light-emitting elements 41 and red light-emitting elements 42 are non-transition light-emitting elements.

Figure 14:
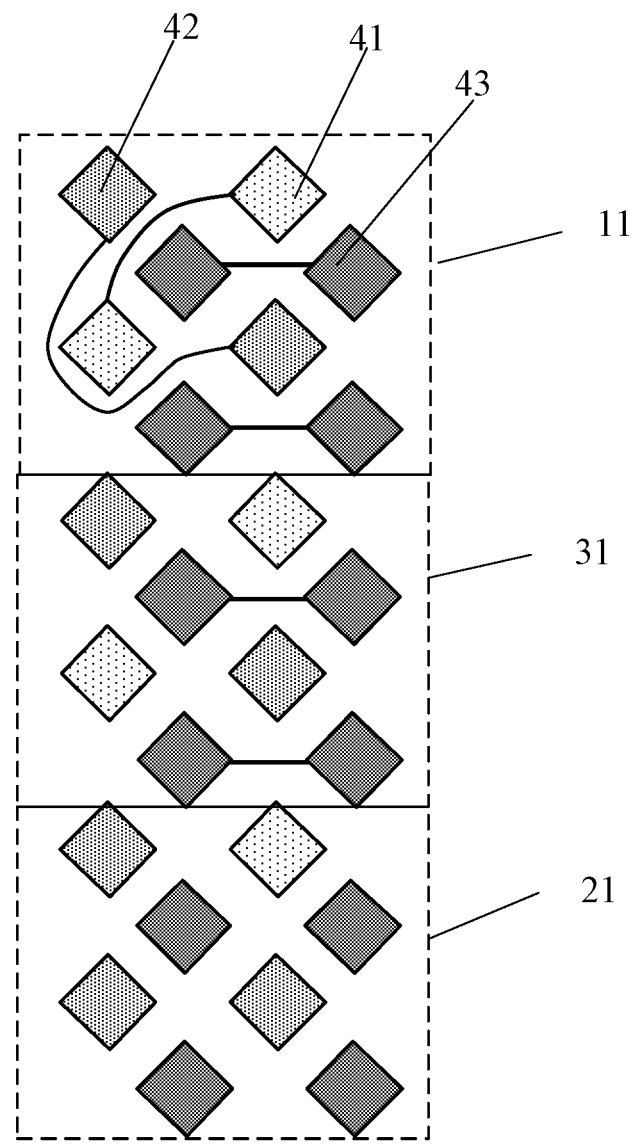
FIG. 14 illustrates a schematic diagram of a first sub-display area, a transition display area, and a second sub-display area in a display panel provided by another embodiment of the present disclosure.

As shown in FIG. 14, in the first sub-display area 11, one of pixel circuits electrically connected to the blue light-emitting elements 41 is electrically connected to two blue light-emitting elements 41, one of pixel circuits electrically connected to the red light-emitting elements 42 is electrically connected to two red light-emitting elements 42, and one of pixel circuits electrically connected to the green light-emitting elements 43 is electrically connected to two green light-emitting elements 43.

In the sub-transition area 31, one of pixel circuits electrically connected to the blue light-emitting elements 41 is electrically connected to one blue light-emitting element 41, one of pixel circuits electrically connected to the red light-emitting elements 42 is electrically connected to one red light-emitting element 42, and one of pixel circuits electrically connected to the green light-emitting elements 43 is electrically connected to two green light-emitting elements 43.

In the second sub-display area 21, one of pixel circuits electrically connected to the blue light-emitting elements 41 is electrically connected to one blue light-emitting element 41, one of pixel circuits electrically connected to the red light-emitting elements 42 is electrically connected to one red light-emitting element 42, one of pixel circuits electrically connected to the green light-emitting elements 43 is electrically connected to one green light-emitting element 43.

In another embodiment, the transition light-emitting elements are selected from two types of first light-emitting elements, second light-emitting elements and third light-emitting elements, and the rest light-emitting elements are non-transition light-emitting elements.

Figure 15:
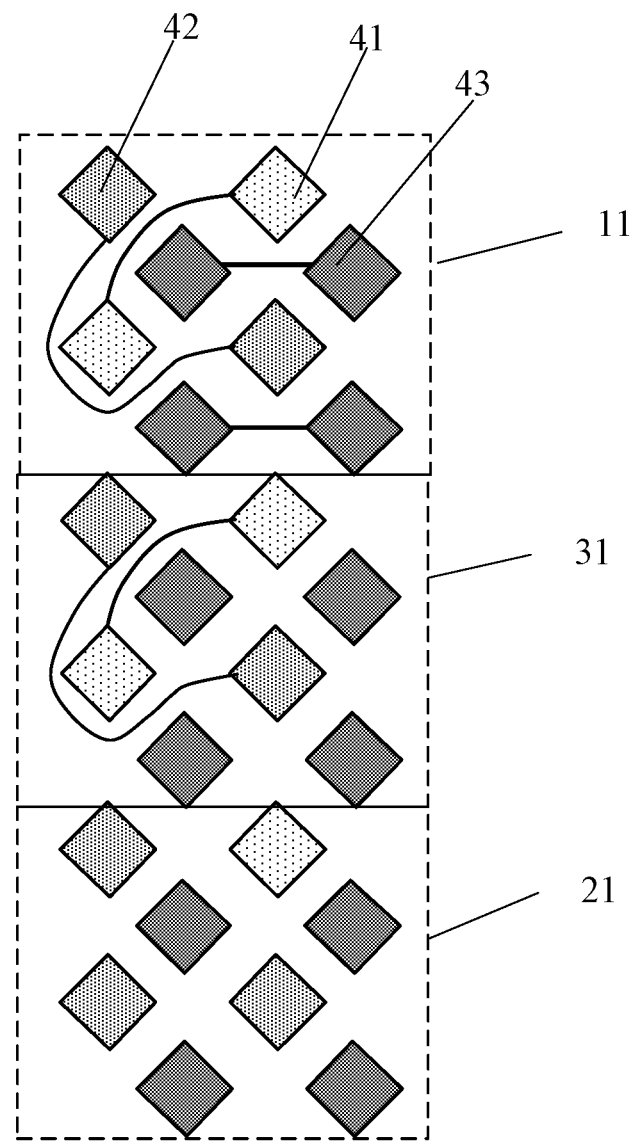
FIG. 15 illustrates a schematic diagram of a first sub-display area, a transition display area, and a second sub-display area in a display panel provided by another embodiment of the present disclosure.

Specifically, in one embodiment, the transition light-emitting elements are the first light-emitting elements and the second light-emitting elements, and the non-transition light-emitting elements are the third light-emitting elements. As shown in FIG. 15, the blue light-emitting elements 41 and the red light-emitting elements 42 are transition light-emitting elements, and the green light-emitting elements 43 are non-transition light-emitting elements.

As shown in FIG. 15, in the first sub-display area 11, one of pixel circuits electrically connected to the blue light-emitting elements 41 is electrically connected to two blue light-emitting elements 41, one of pixel circuits electrically connected to the red light-emitting elements 42 is electrically connected to two red light-emitting elements 42, and one of pixel circuits electrically connected to the green light-emitting elements 43 is electrically connected to two green light-emitting elements 43.

In the sub-transition area 31, one of pixel circuits electrically connected to the blue light-emitting elements 41 is electrically connected to two blue light-emitting elements 41, one of pixel circuits electrically connected to the red light-emitting elements 42 is electrically connected to two red light-emitting elements 42, one of pixel circuits electrically connected to the green light-emitting elements 43 is electrically connected to one green light-emitting element 43.

In the second sub-display area 21, one of pixel circuits electrically connected to the blue light-emitting elements 41 is electrically connected to one blue light-emitting element 41, one of pixel circuits electrically connected to the red light-emitting elements 42 is electrically connected to one red light-emitting element 42, and one of pixel circuits electrically connected to the green light-emitting elements 43 is electrically connected to one green light-emitting element 43.

Figure 16:
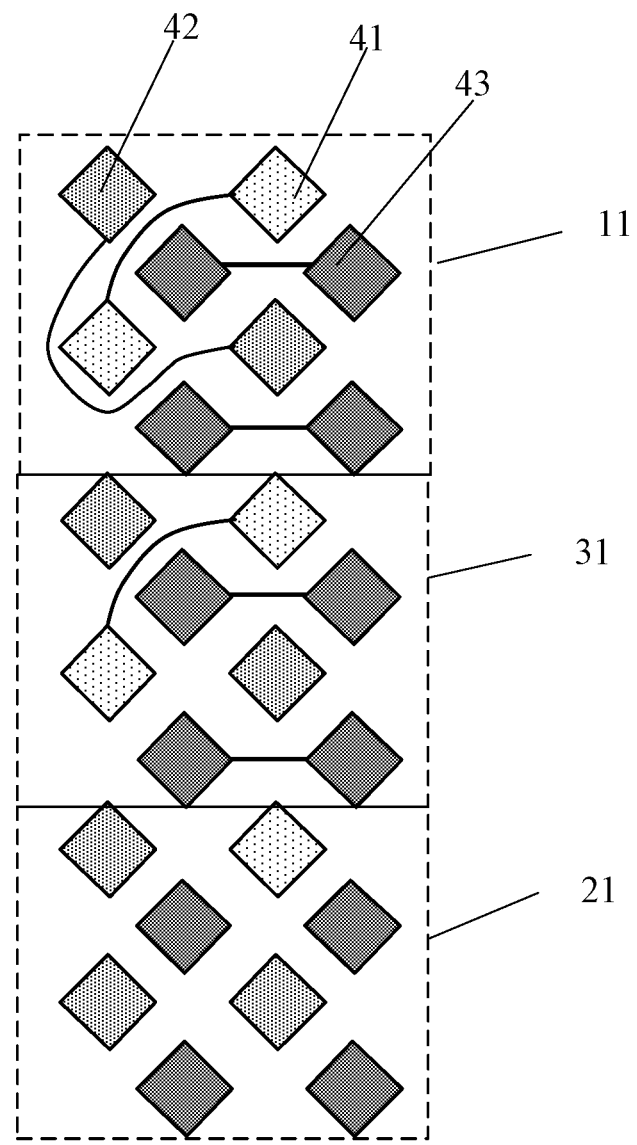
FIG. 16 illustrates a schematic diagram of a first sub-display area, a transition display area, and a second sub-display area in a display panel provided by another embodiment of the present disclosure.
Figure 17:
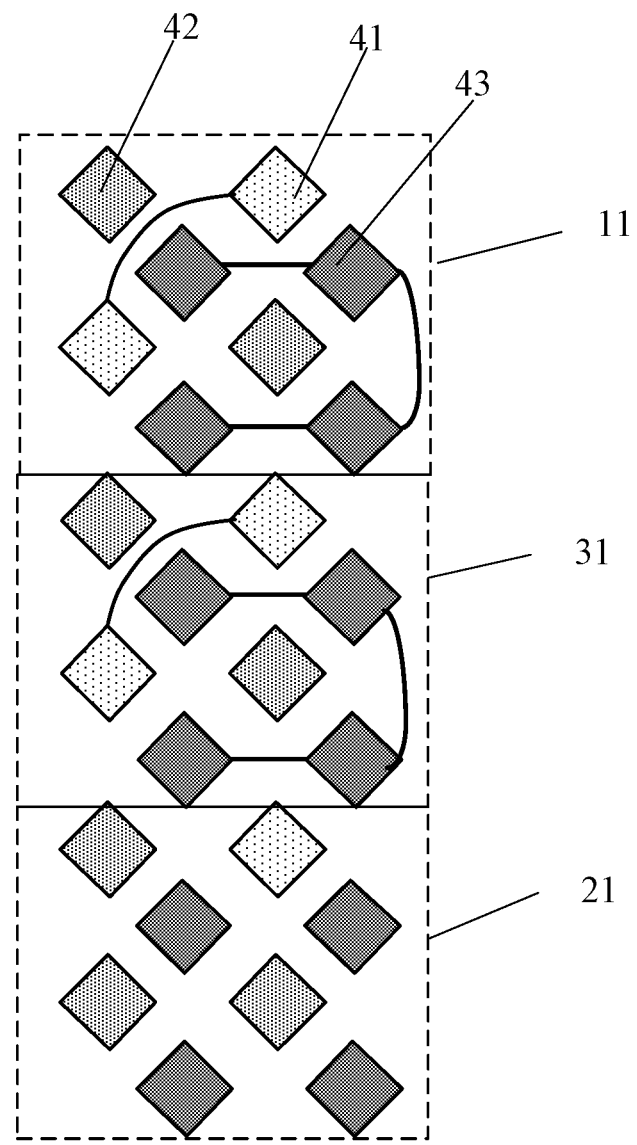
FIG. 17 illustrates a schematic diagram of a first sub-display area, a transition display area, and a second sub-display area in a display panel provided by another embodiment of the present disclosure.

In another embodiment, the transition light-emitting elements are the first light-emitting elements and the third light-emitting elements, and the non-transition light-emitting elements are the second light-emitting elements. As shown in FIGS. 16 and 17, the blue light-emitting elements 41 and the green light-emitting elements 43 are transition light-emitting elements, and the red light-emitting elements 42 are non-transition light-emitting elements.

Specifically, in one embodiment, as shown in FIG. 16, in the first sub-display area 11, one of pixel circuits electrically connected to the blue light-emitting elements 41 is electrically connected to two blue light-emitting elements 41, one of pixel circuits electrically connected to the red light-emitting elements 42 is electrically connected to two red light-emitting elements 42, and one of pixel circuits electrically connected to the green light-emitting elements 43 is electrically connected to two green light-emitting elements 43.

In the sub-transition area 31, one of pixel circuits electrically connected to the blue light-emitting elements 41 is electrically connected to two blue light-emitting elements 41, one of pixel circuits electrically connected to the red light-emitting elements 42 is electrically connected to one red light-emitting element 42, and one of pixel circuits electrically connected to the green light-emitting elements 43 is electrically connected to two green light-emitting elements 43.

In the second sub-display area 21, one of pixel circuits electrically connected to the blue light-emitting elements 41 is electrically connected to one blue light-emitting element 41, one of pixel circuits electrically connected to the red light-emitting elements 42 is electrically connected to one red light-emitting element 42, and one of pixel circuits electrically connected to the green light-emitting elements 43 is electrically connected to one green light-emitting element 43.

In another embodiment, as shown in FIG. 17, in the first sub-display area 11, one of pixel circuits electrically connected to the blue light-emitting elements 41 is electrically connected to two blue light-emitting elements 41, one of pixel circuits electrically connected to the red light-emitting elements 42 is electrically connected to two red light-emitting elements 42, and one of pixel circuits electrically connected to the green light-emitting elements 43 is electrically connected to four green light-emitting elements 43.

In the sub-transition area 31, one of pixel circuits electrically connected to the blue light-emitting elements 41 is electrically connected to two blue light-emitting elements 41, one of pixel circuits electrically connected to the red light-emitting elements 42 is electrically connected to one red light-emitting element 42, and one of pixel circuits electrically connected to the green light-emitting elements 43 is electrically connected to four green light-emitting elements 43.

In the second sub-display area 21, one of pixel circuits electrically connected to the blue light-emitting elements 41 is electrically connected to one blue light-emitting element 41, one of pixel circuits electrically connected to the red light-emitting elements 42 is electrically connected to one red light-emitting element 42, and one of pixel circuits electrically connected to the green light-emitting elements 43 is electrically connected to one green light-emitting element 43.

Figure 18:
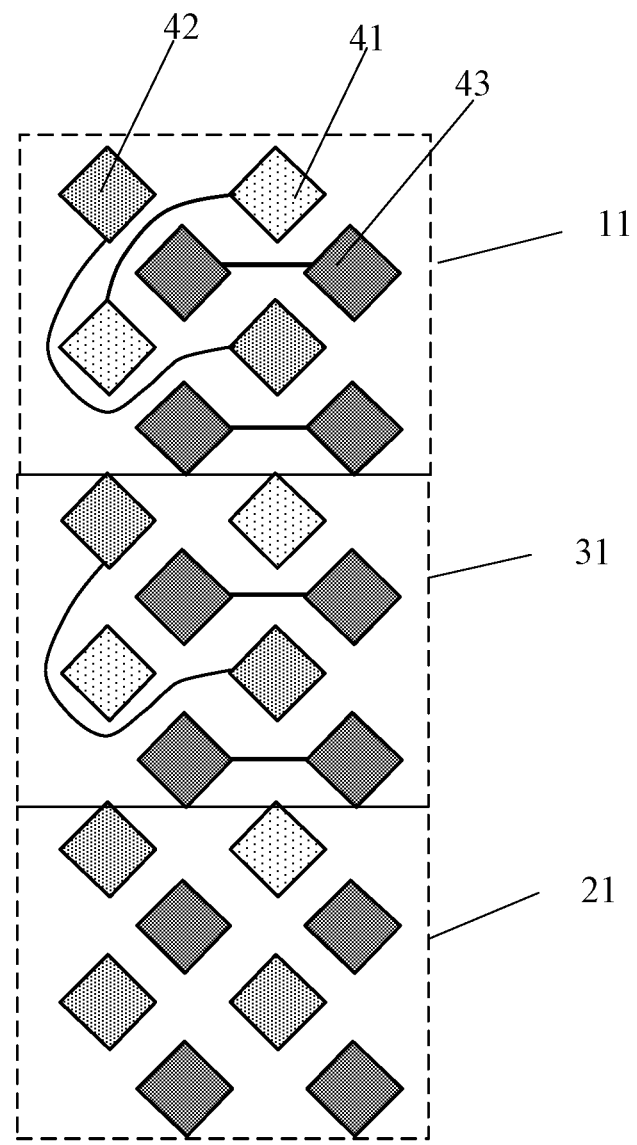
FIG. 18 illustrates a schematic diagram of a first sub-display area, a transition display area, and a second sub-display area in a display panel provided by another embodiment of the present disclosure.

In another embodiment, the transition light-emitting elements are the second light-emitting elements and the third light-emitting elements, and the non-transition light-emitting elements are the first light-emitting elements. As shown in FIG. 18, the red light-emitting elements 42 and the green light-emitting elements 43 are transition light-emitting elements, and the blue light-emitting elements 41 are non-transition light-emitting elements.

Specially, in one embodiment, as shown in FIG. 18, in the first sub-display area 11, one of pixel circuits electrically connected to the blue light-emitting elements 41 is electrically connected to two blue light-emitting elements 41, one of pixel circuits electrically connected to the red light-emitting elements 42 is electrically connected to two red light-emitting elements 42, and one of pixel circuits electrically connected to the green light-emitting elements 43 is electrically connected to two green light-emitting elements 43.

In the sub-transition area 31, one of pixel circuits electrically connected to the blue light-emitting elements 41 is electrically connected to one blue light-emitting element 41, one of pixel circuits electrically connected to the red light-emitting elements 42 is electrically connected to two red light-emitting elements 42, and one of pixel circuits electrically connected to the green light-emitting elements 43 is electrically connected to two green light-emitting elements 43.

In the second sub-display area 21, one of pixel circuits electrically connected to the blue light-emitting elements 41 is electrically connected to one blue light-emitting element 41, one of pixel circuits electrically connected to the red light-emitting elements 42 is electrically connected to one red light-emitting element 42, and one of pixel circuits electrically connected to the green light-emitting elements 43 is electrically connected to one green light-emitting element 43.

In the sub-transition area, a driving relationship between the transition light-emitting elements and the pixel circuits is described below.

As shown in FIG. 12, when the first light-emitting elements are selected as the transition light-emitting elements, one pixel circuit drives two first light-emitting elements. As shown in FIG. 13, when the second light-emitting elements are selected as the transition light-emitting elements, one pixel circuit drives two second light-emitting elements; as shown in FIG. 14, when the third light-emitting elements are selected as the transition light-emitting elements, one pixel circuit drives two third light-emitting elements; or as shown in FIG. 15, one pixel circuit drives four third light-emitting elements, which is not limited herein and depends on a specific situation.

Since a sensitivity of a human eye to green is greater than a sensitivity of a human eye to red and is greater than a sensitivity of a human eye to blue, at least the first light-emitting elements can be selected as the transition light-emitting elements. That is, at least the blue light-emitting elements are the transition light-emitting elements, which is not limited herein and depends on a specific situation.

It should also be noted that the accompanying drawings corresponding to the above embodiments are all illustrated by taking the transition display area including a sub-transition area as an example, which is not limited herein. In other embodiments, the transition display area may further include a plurality of sub-transition areas, depending on a specific situation.

Figure 19:
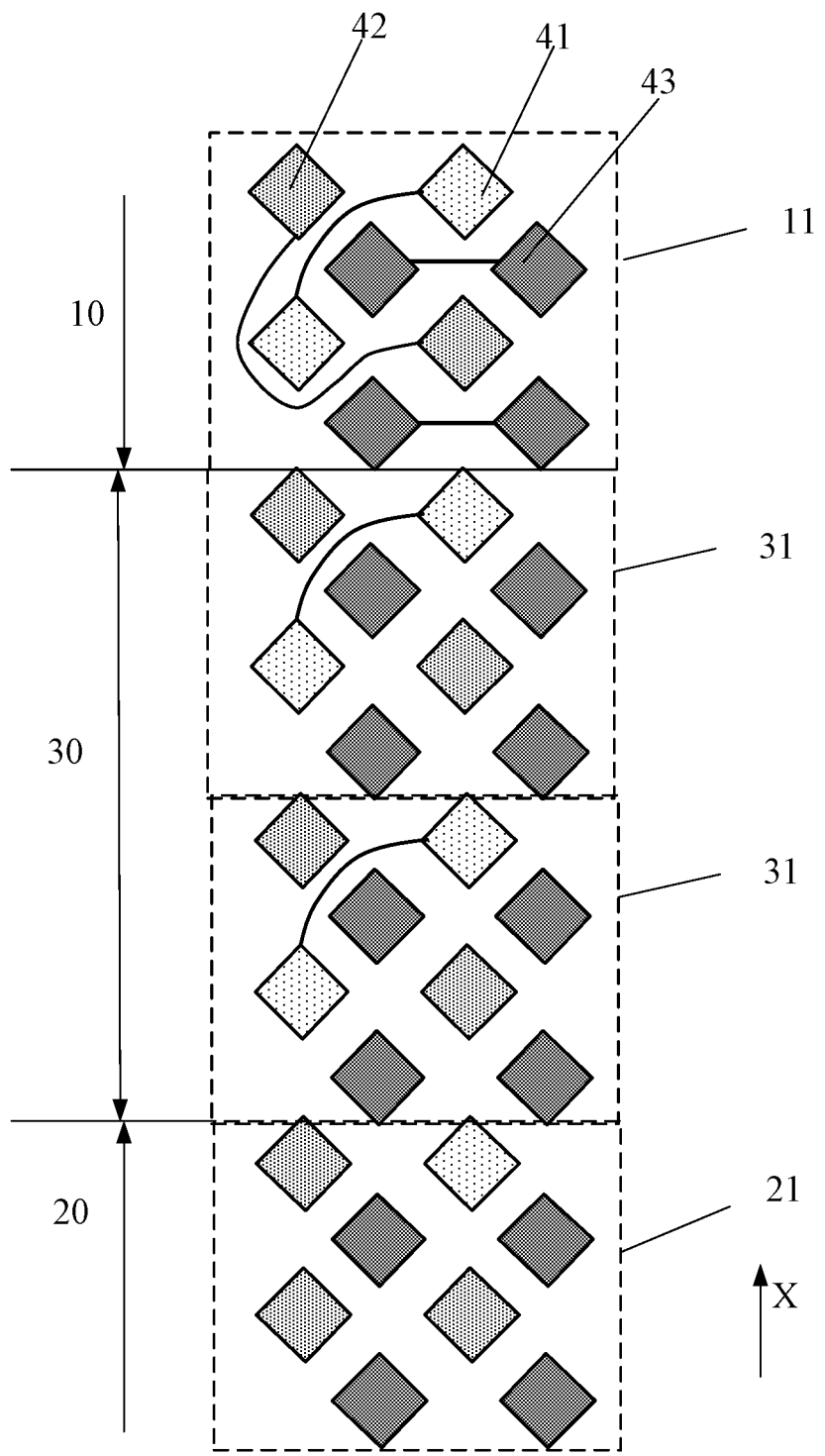
FIG. 19 illustrates a schematic diagram of a first sub-display area, a transition display area, and a second sub-display area in a display panel provided by another embodiment of the present disclosure.

The transition display area may include at least two sub-transition areas. Optionally, in one implementation, along a first direction X, at least two sub-transition areas 31 are disposed adjacent to each other. As shown in FIG. 19, the first direction X is a direction in which the second display area 20 points to the first display area 10.

Along the first direction, the first light-emitting elements, the second light-emitting elements and the third light-emitting elements are selected in a same manner as transition light-emitting elements and non-transition light-emitting elements in at least two adjacent sub-transition areas.

Figure 20:
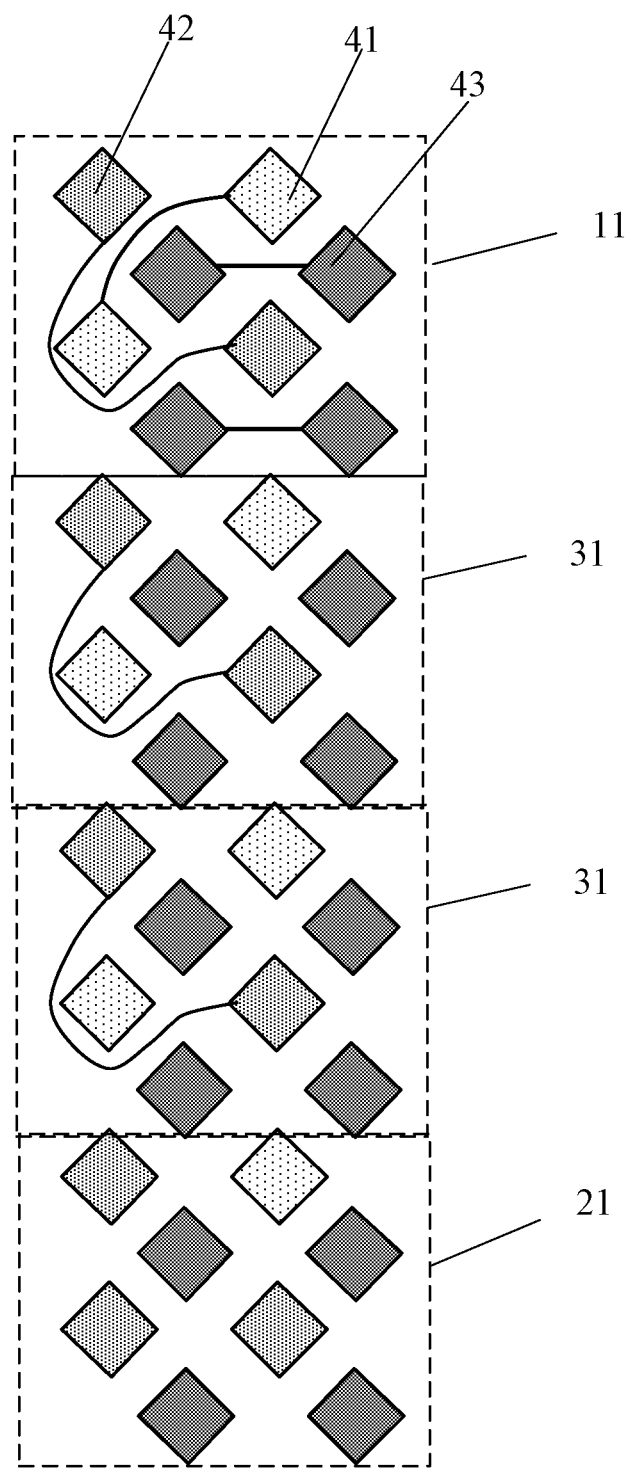
FIG. 20 illustrates a schematic diagram of a first sub-display area, a transition display area, and a second sub-display area in a display panel provided by another embodiment of the present disclosure.
Figure 21:
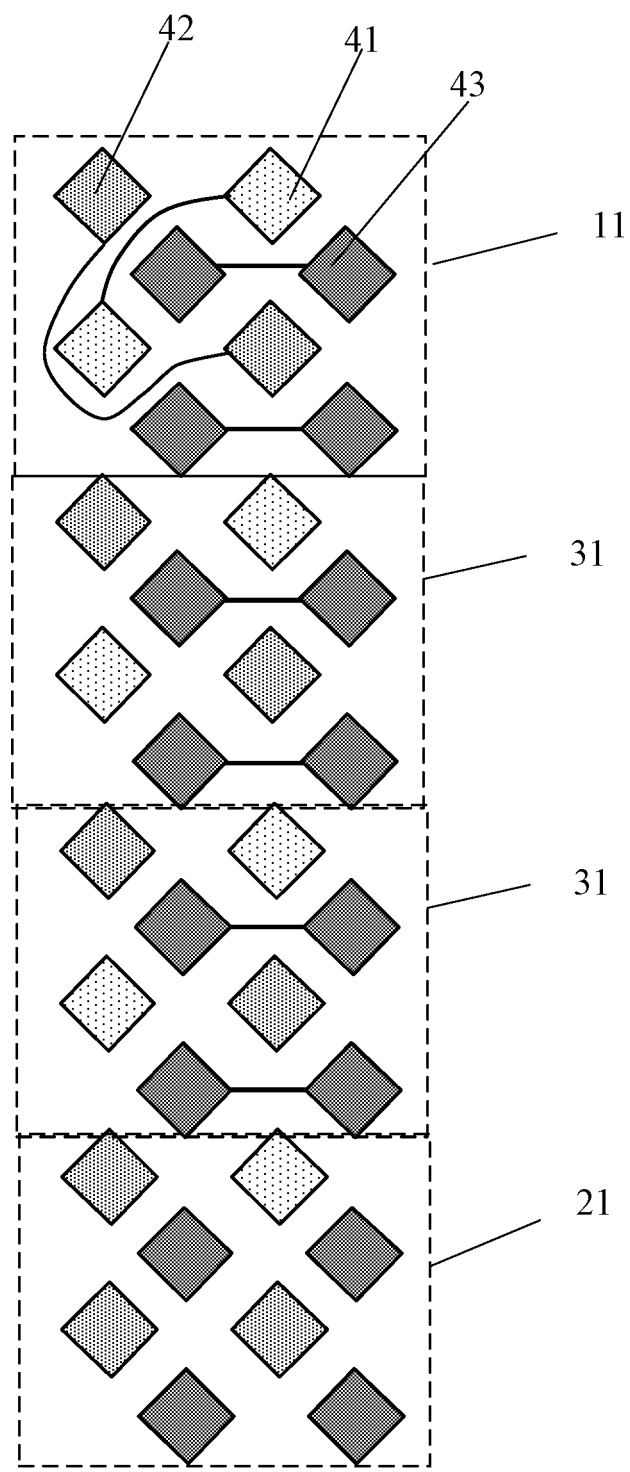
FIG. 21 illustrates a schematic diagram of a first sub-display area, a transition display area, and a second sub-display area in a display panel provided by another embodiment of the present disclosure.

Specifically, in one embodiment, when one type of the first light-emitting elements, the second light-emitting elements, and the third light-emitting elements are selected as the transition light-emitting elements, the transition light-emitting elements in each sub-transition area may all be the first light-emitting elements. As shown in FIG. 19, along the first direction X, the transition light-emitting elements in at least two adjacent sub-transition areas 31 are all blue light-emitting elements and may also be all second light-emitting elements; as shown in FIG. 20, along the first direction X, the transition light-emitting elements in at least two adjacent sub-transition areas 31 are all red light-emitting elements and may also be all third light-emitting elements; as shown in FIG. 21, along the first direction X, the transition light-emitting elements in at least two adjacent sub-transition areas 31 are all green light-emitting elements, which is not limited herein and depends on a specific situation.

Figure 22:
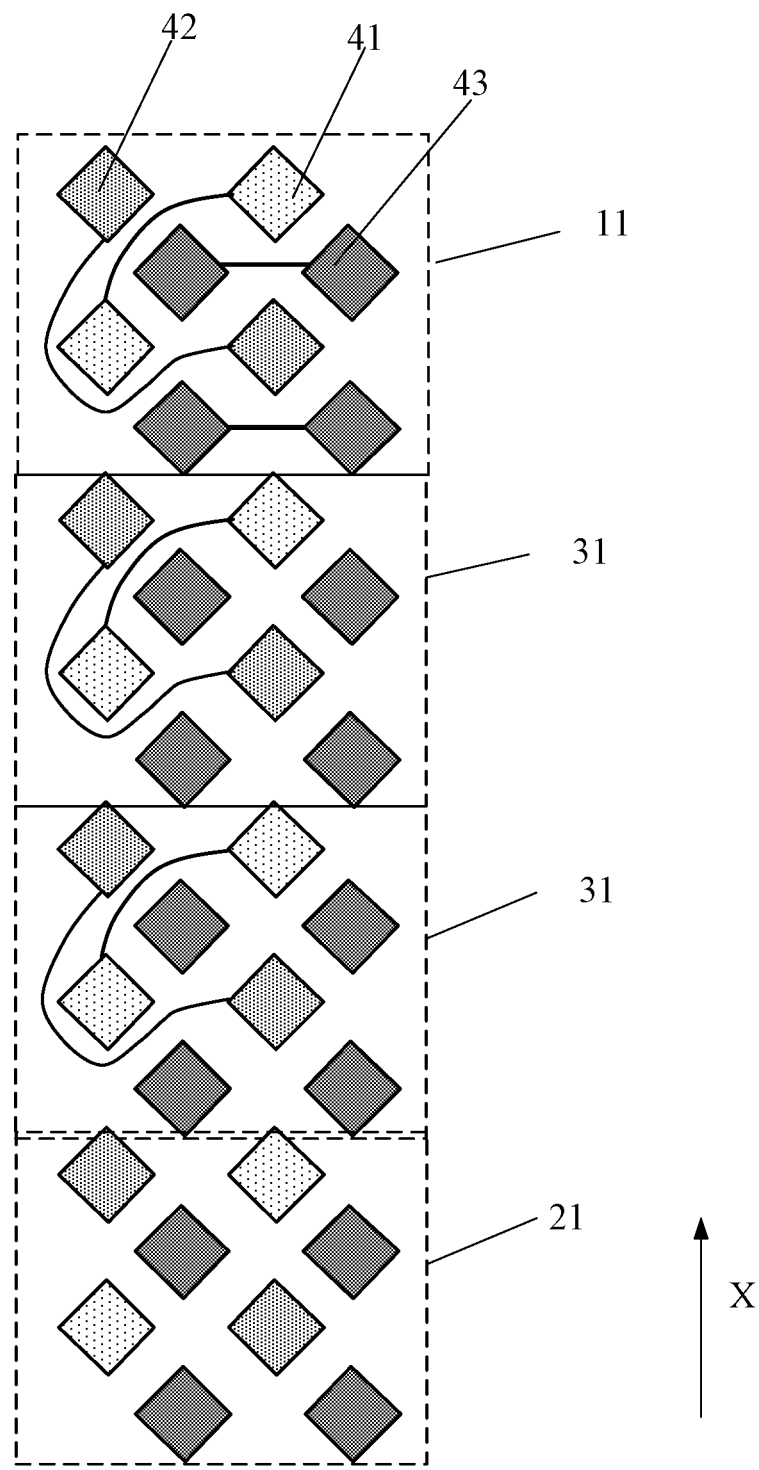
FIG. 22 illustrates a schematic diagram of a first sub-display area, a transition display area, and a second sub-display area in a display panel provided by another embodiment of the present disclosure.
Figure 23:
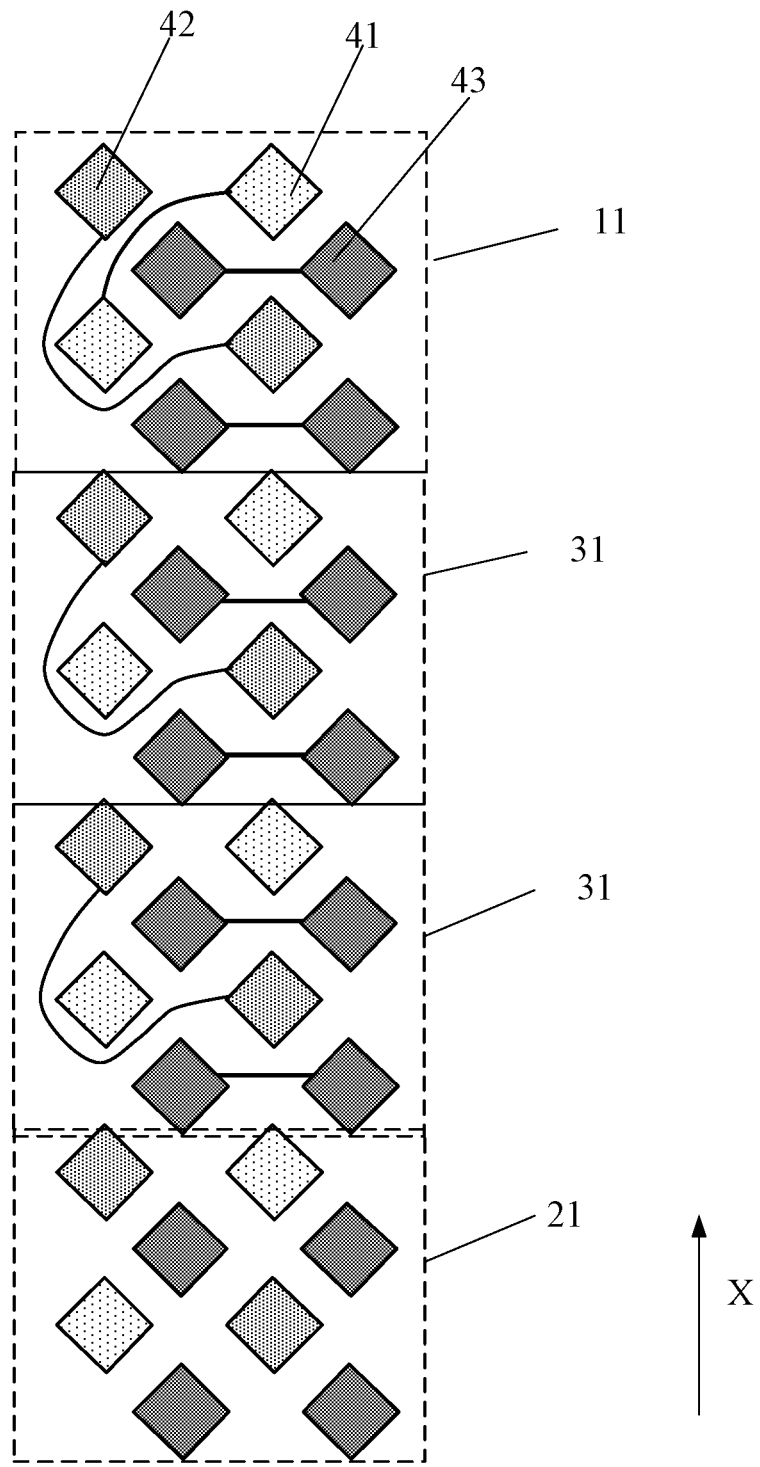
FIG. 23 illustrates a schematic diagram of a first sub-display area, a transition display area, and a second sub-display area in a display panel provided by another embodiment of the present disclosure.
Figure 24:
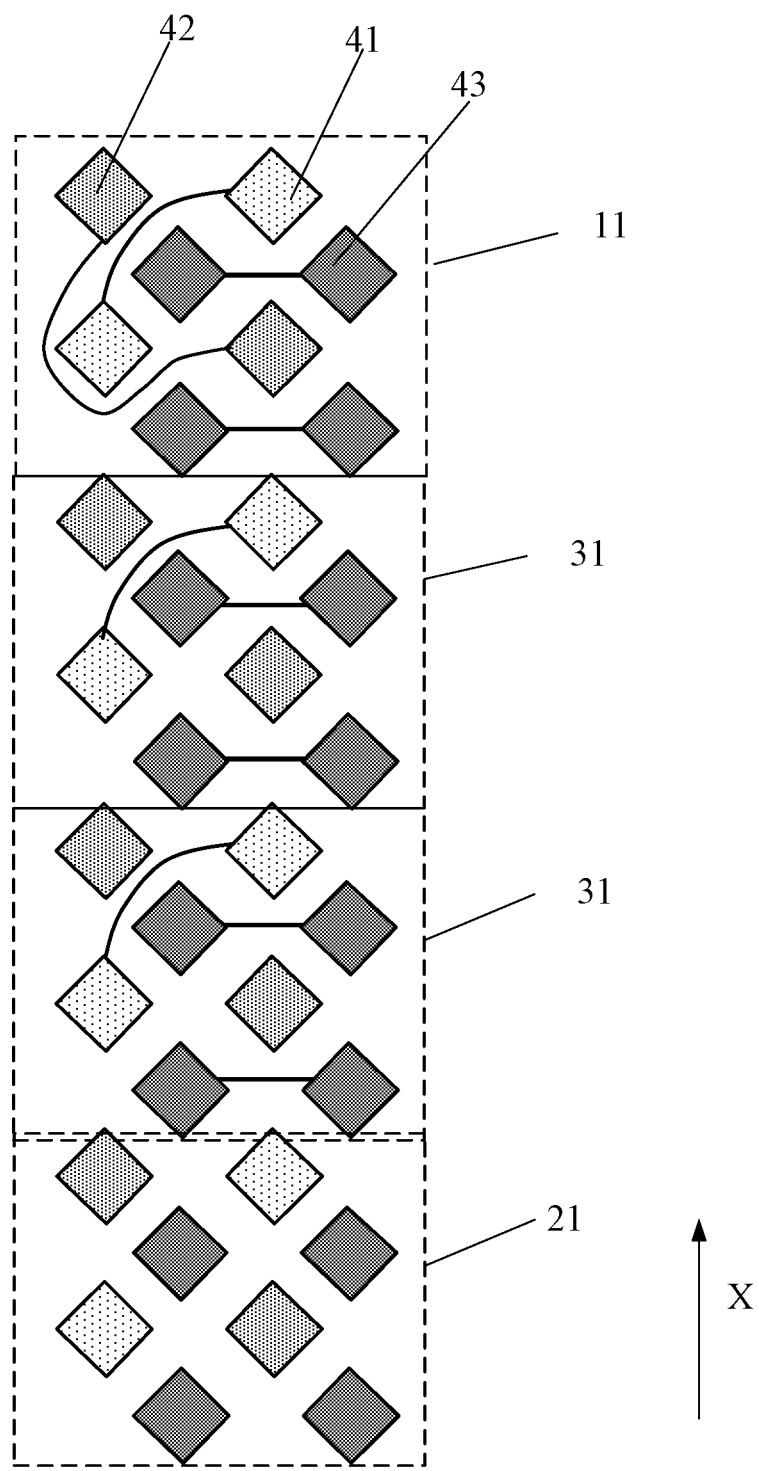
FIG. 24 illustrates a schematic diagram of a first sub-display area, a transition display area, and a second sub-display area in a display panel provided by another embodiment of the present disclosure.

In another embodiment, when two types of the first light-emitting elements, the second light-emitting elements and the third light-emitting elements are selected as the transition light-emitting elements, the transition light-emitting elements in each sub-transition area may be all first light-emitting elements and second light-emitting elements. As shown in FIG. 22, along the first direction X, the transition light-emitting elements in each sub-transition area may be all blue light-emitting elements and red light-emitting elements; as shown in FIG. 23, along the first direction X, the transition light-emitting elements in at least two adjacent sub-transition areas 31 are red light-emitting elements and green light-emitting elements and may also be all first light-emitting elements and third light-emitting elements; as shown in FIG. 24, along the first direction X, the transition light-emitting elements in at least two adjacent sub-transition areas 31 are all blue light-emitting elements and green light-emitting elements, which is not limited herein and depends on a specific situation.

In another embodiment, along the first direction, the first light-emitting element, the second light-emitting element, and the third light-emitting element may be selected in a different selection manner as the transition light-emitting elements and non-transition light-emitting elements in at least two adjacent sub-transition areas.

Figure 25:
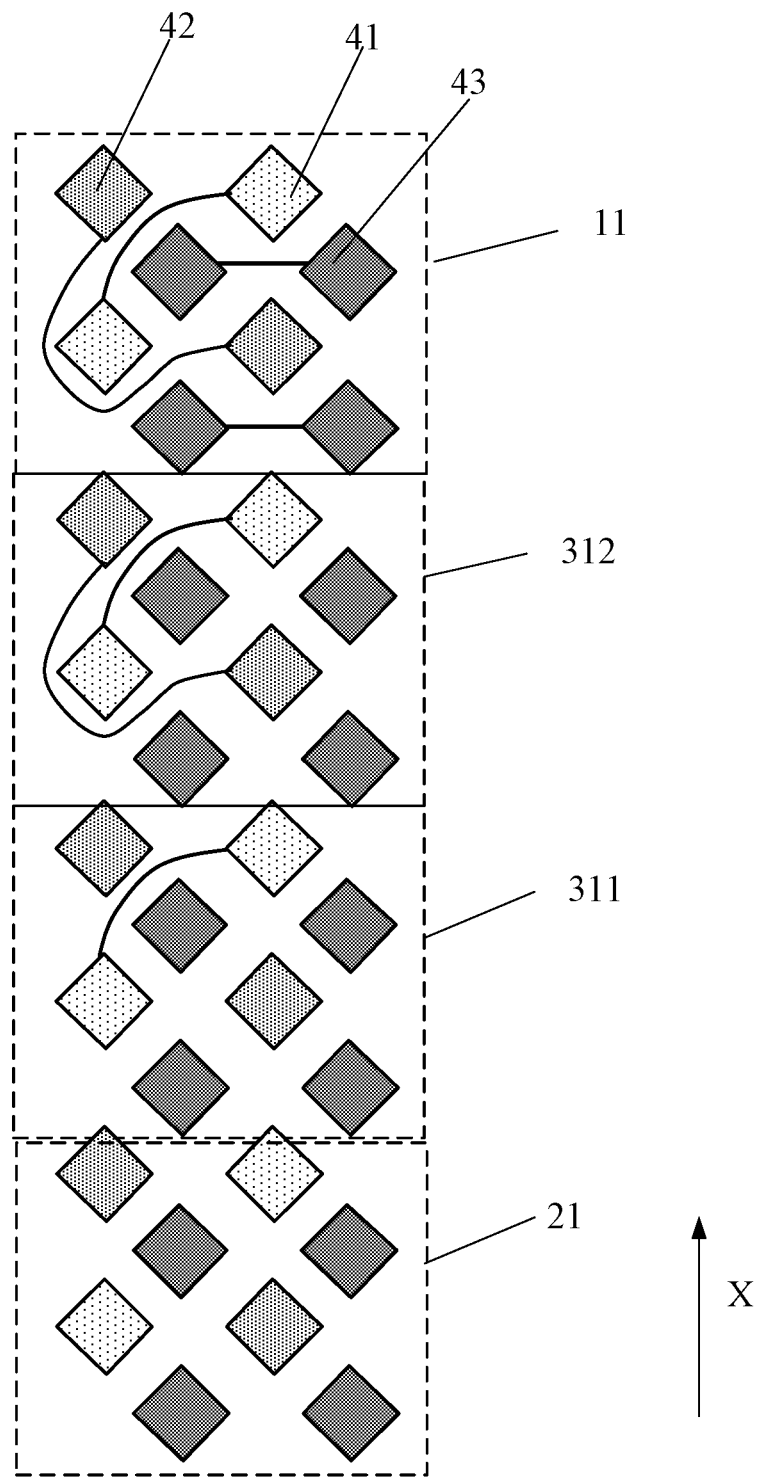
FIG. 25 illustrates a schematic diagram of a first sub-display area, a transition display area, and a second sub-display area in a display panel provided by another embodiment of the present disclosure.

Specifically, in one embodiment, the transition display area includes at least two sub-transition areas, and the at least two sub-transition areas include a first sub-transition area and a second sub-transition area. As shown in FIG. 25, the transition display area includes a first sub-transition area 311 and a second sub-transition area 312. The first sub-transition area 311 includes one transition light-emitting element and two non-transition light-emitting elements, and the second transition area 312 includes two transition light-emitting elements and one non-transition light-emitting element.

As shown in FIG. 25, in the first sub-transition area 311, the transition light-emitting elements are the first light-emitting elements, the non-transition light-emitting elements are the second light-emitting element and the third light-emitting elements. That is, in the first sub-transition area 311, the transition light-emitting elements are blue light-emitting elements 41, and the non-transition light-emitting elements are the red light-emitting elements 42 and the green light-emitting elements 43. In the second sub-transition area 312, the transition light-emitting elements are the first light-emitting elements and the second light-emitting elements, the non-transition light-emitting elements are the third light-emitting element. That is, in the second sub-transition area 312, the transition light-emitting elements are the blue light-emitting elements 41 and the red light-emitting elements 42, and the non-transition light-emitting elements are the green light-emitting elements 43.

Figure 26:
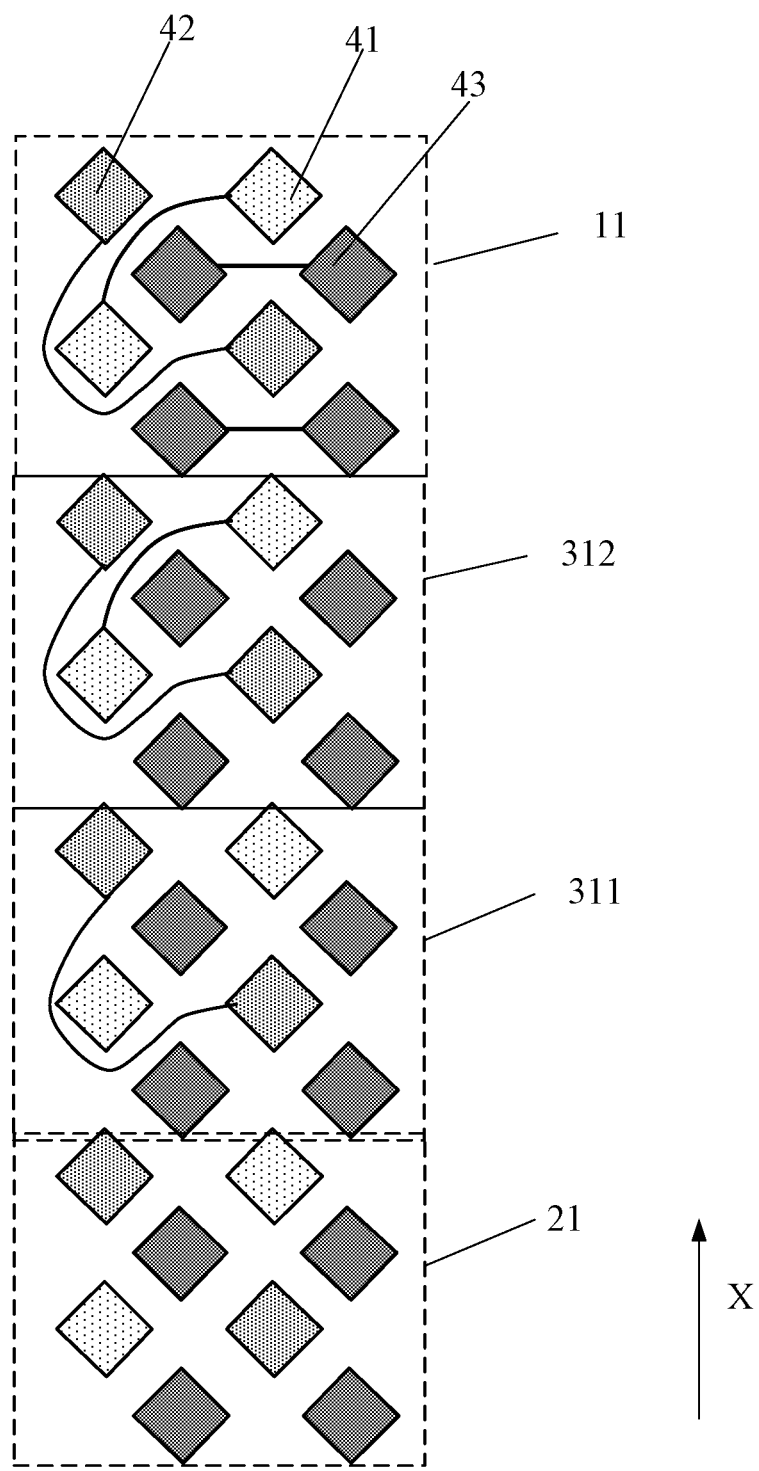
FIG. 26 illustrates a schematic diagram of a first sub-display area, a transition display area, and a second sub-display area in a display panel provided by another embodiment of the present disclosure.

In another embodiment, as shown in FIG. 26, in the first sub-transition area 311, the transition light-emitting elements are the second light-emitting elements, and the non-transition light-emitting elements are the first light-emitting elements and the third light-emitting elements. That is, in the first sub-transition area 311, the transition light-emitting elements are the red light-emitting elements 42, and the non-transition light-emitting elements are the blue light-emitting elements 41 and the green light-emitting elements 43. In the second sub-transition area 312, the transition light-emitting elements are the first light-emitting elements and the second light-emitting elements, and the non-transition light-emitting elements are the third light-emitting elements. That is, in the second sub-transition area 312, the transition light-emitting elements are the blue light-emitting elements 41 and the red light-emitting elements 42, and the non-transition light-emitting elements are the green light-emitting elements 43.

Figure 27:
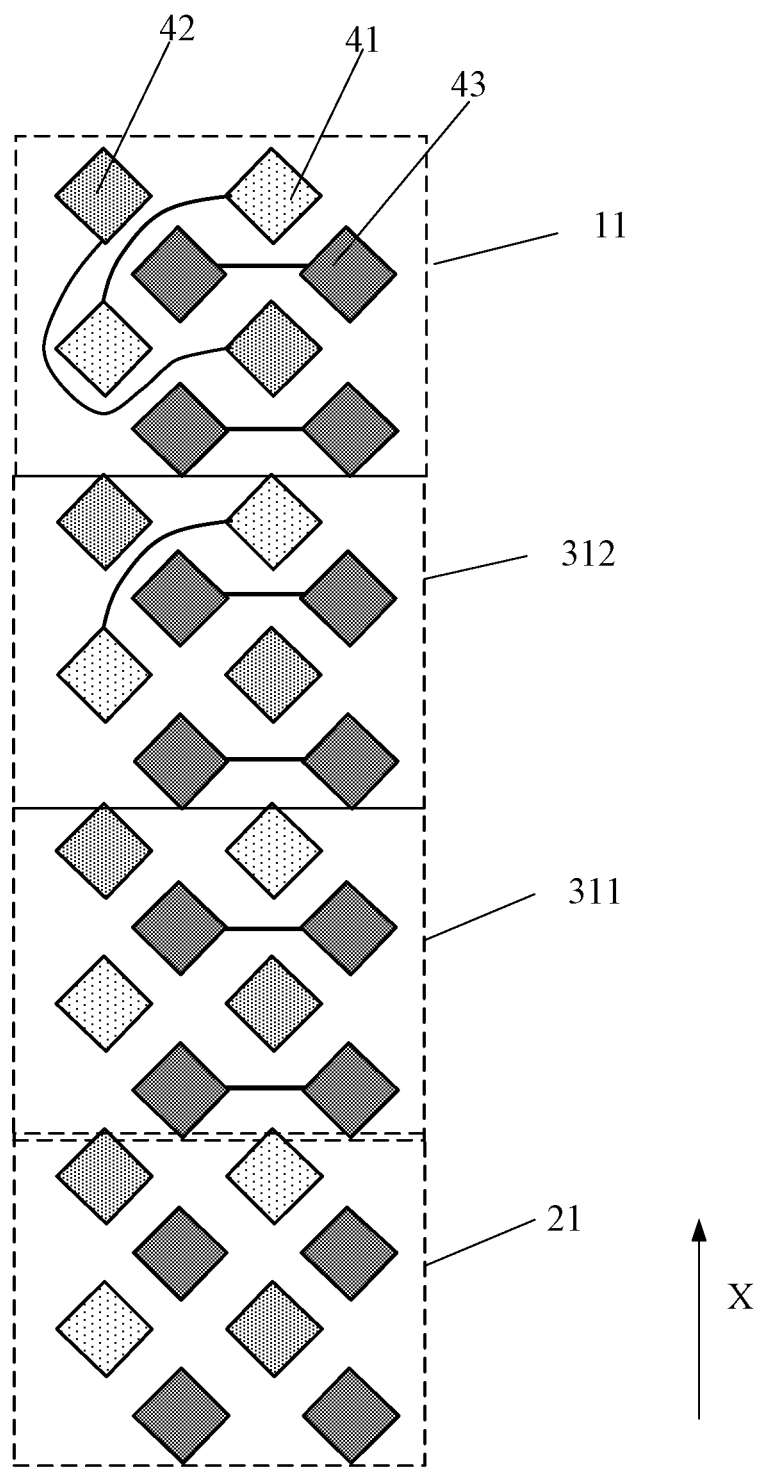
FIG. 27 illustrates a schematic diagram of a first sub-display area, a transition display area, and a second sub-display area in a display panel provided by another embodiment of the present disclosure.

In another embodiment, as shown in FIG. 27, in the first sub-transition area 311, the transition light-emitting elements are the third light-emitting elements, and the non-transition light-emitting elements are the first light-emitting elements and the second light-emitting elements. That is, in the first sub-transition area 311, the transition light-emitting elements are the green light-emitting elements 43, and the non-transition light-emitting elements are the blue light-emitting elements 41 and the red light-emitting elements 42. In the second sub-transition area 312, the transition light-emitting elements are the first light-emitting elements and the third light-emitting elements, and the non-transition light-emitting elements are the second light-emitting elements. That is, in the second sub-transition area 312, the transition light-emitting elements are the blue light-emitting elements 41 and the green light-emitting elements 43, and the non-transition light-emitting elements are the red light-emitting elements 42.

Figure 28:
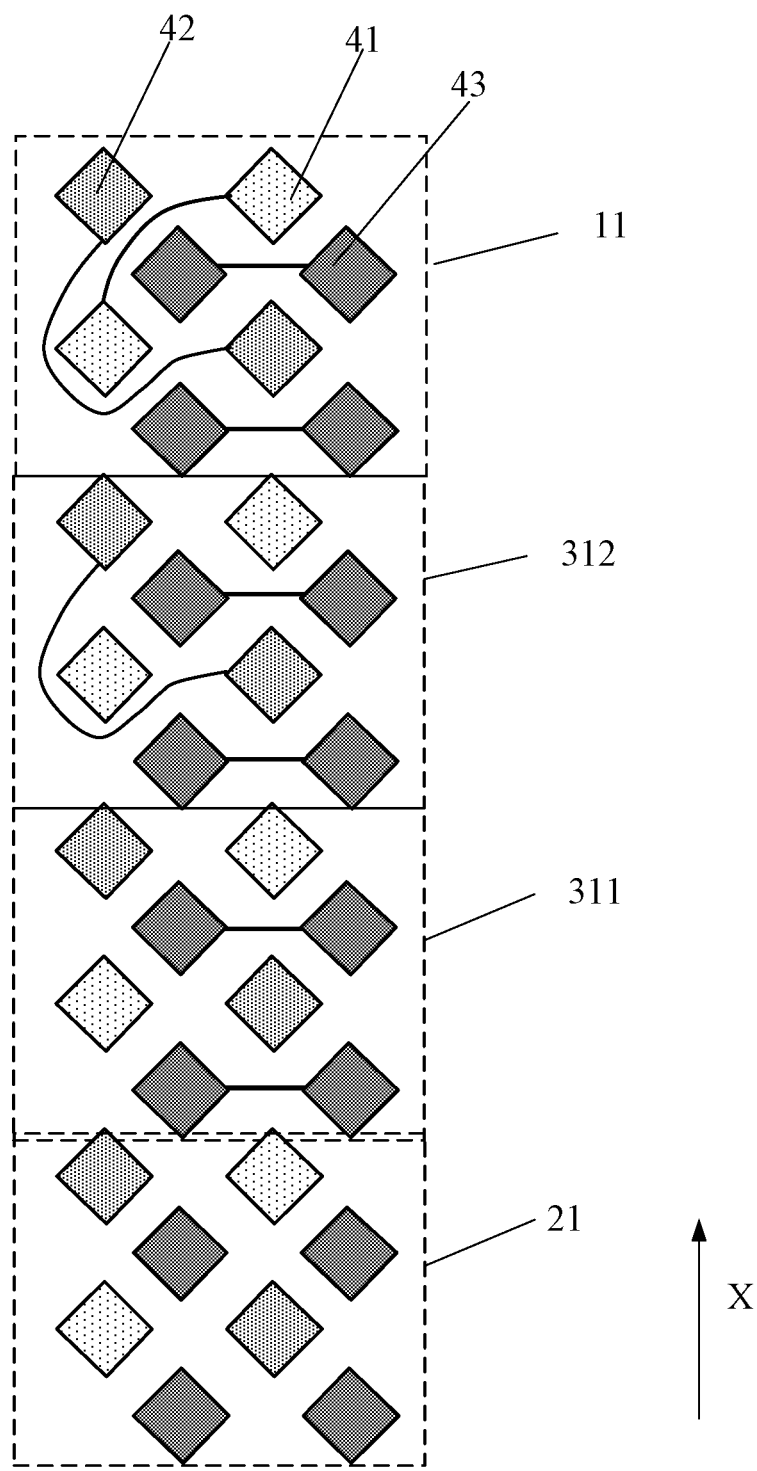
FIG. 28 illustrates a schematic diagram of a first sub-display area, a transition display area, and a second sub-display area in a display panel provided by another embodiment of the present disclosure.

In another embodiment, as shown in FIG. 28, in the first sub-transition area 311, the transition light-emitting elements are the third light-emitting elements, and the non-transition light-emitting elements are the first light-emitting elements and the second light-emitting elements. That is, in the first sub-transition area 311, the transition light-emitting elements are the green light-emitting elements 43, and the non-transition light-emitting elements are the blue light-emitting elements 41 and the red light-emitting elements 42. In the second sub-transition area 312, the transition light-emitting elements are the second light-emitting elements and the third light-emitting elements, and the non-transition light-emitting elements are the first light-emitting elements. That is, in the second sub-transition area 312, the transition light-emitting elements are the red light-emitting elements 42 and the green light-emitting elements 43, and the non-transition light-emitting elements are the blue light-emitting elements 41.

Figure 29:
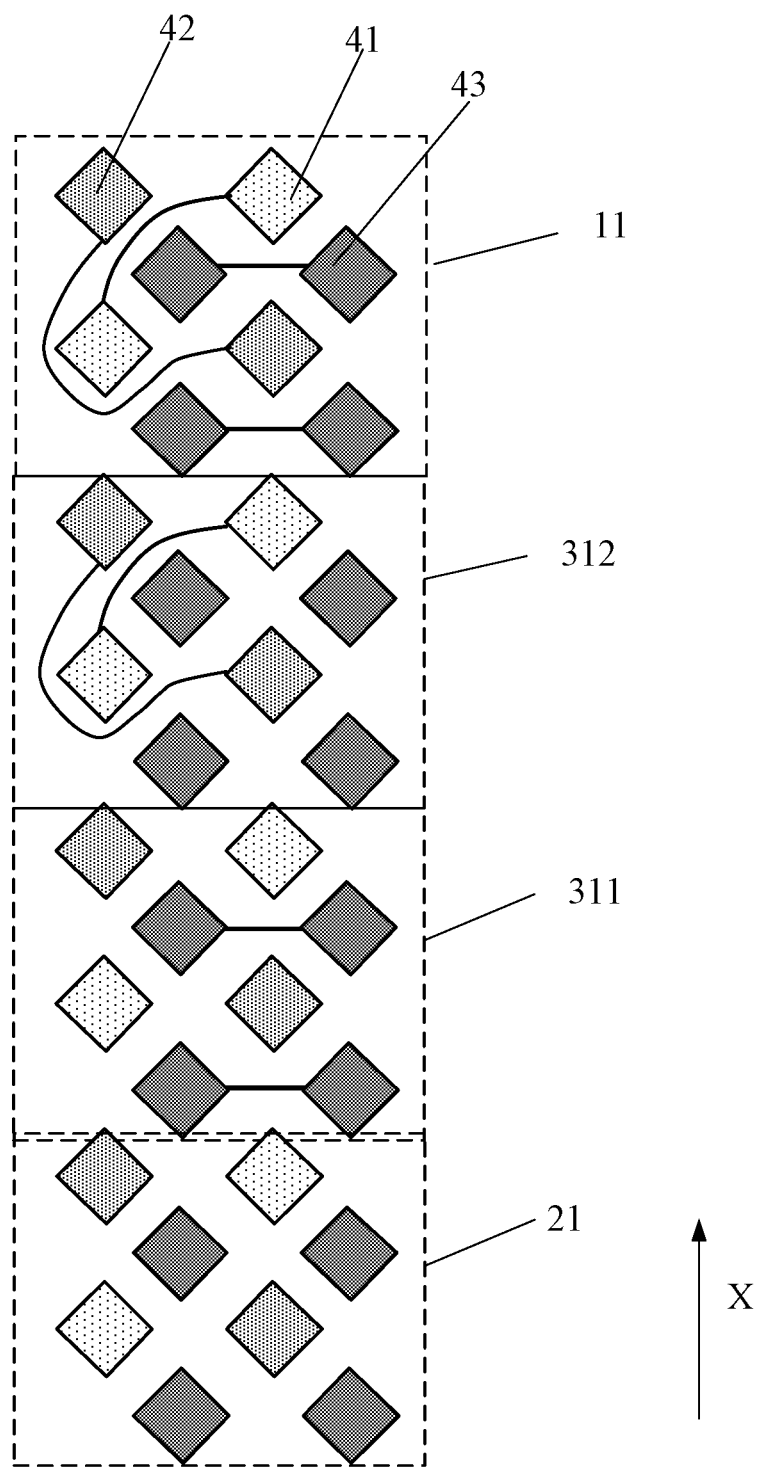
FIG. 29 illustrates a schematic diagram of a first sub-display area, a transition display area, and a second sub-display area in a display panel provided by another embodiment of the present disclosure.

In another embodiment, as shown in FIG. 29, in the first sub-transition area 311, the transition light-emitting elements are the third light-emitting elements, and the non-transition light-emitting elements are the first light-emitting elements and the second light-emitting elements. That is, in the first sub-transition area 311, the transition light-emitting elements are the green light-emitting elements 43, and the non-transition light-emitting elements are the blue light-emitting elements 41 and the red light-emitting elements 42. In the second sub-transition area 312, the transition light-emitting elements are the first light-emitting elements and the second light-emitting elements, and the non-transition light-emitting elements are the third light-emitting elements. That is, in the second sub-transition area 312, the transition light-emitting elements are the blue light-emitting elements 41 and the red light-emitting elements 42, and the non-transition light-emitting elements are the green light-emitting elements 43.

As shown in FIGS. 25-29, the second sub-transition area 312 is on a side of the first sub-transition area 311 close to the first display area, that is, the second sub-transition area 312 is on a side of the first sub-transition area 311 close to the first sub-display area 11 to improve a display gradient effect from the first display area to the second display area and improve a user experience.

As shown in FIGS. 25-28, in one embodiment, one of two types of transition light-emitting elements in the second sub-transition area is same as the transition light-emitting element in the first sub-transition area, which is not limited herein. In other embodiments, as shown in FIG. 29, the two types of transition light-emitting elements in the second sub-transition area may also be different from the transition light-emitting elements in the first sub-transition area, depending on a specific situation.

Figure 30:
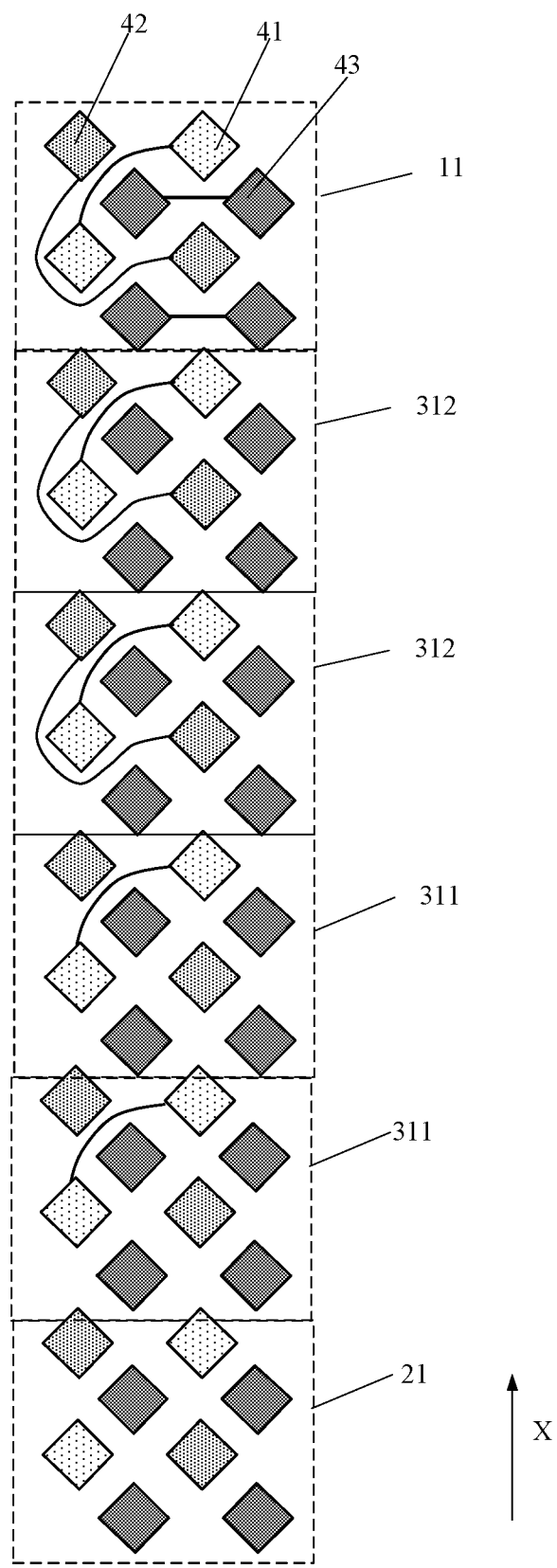
FIG. 30 illustrates a schematic diagram of a first sub-display area, a transition display area, and a second sub-display area in a display panel provided by another embodiment of the present disclosure.
Figure 31:
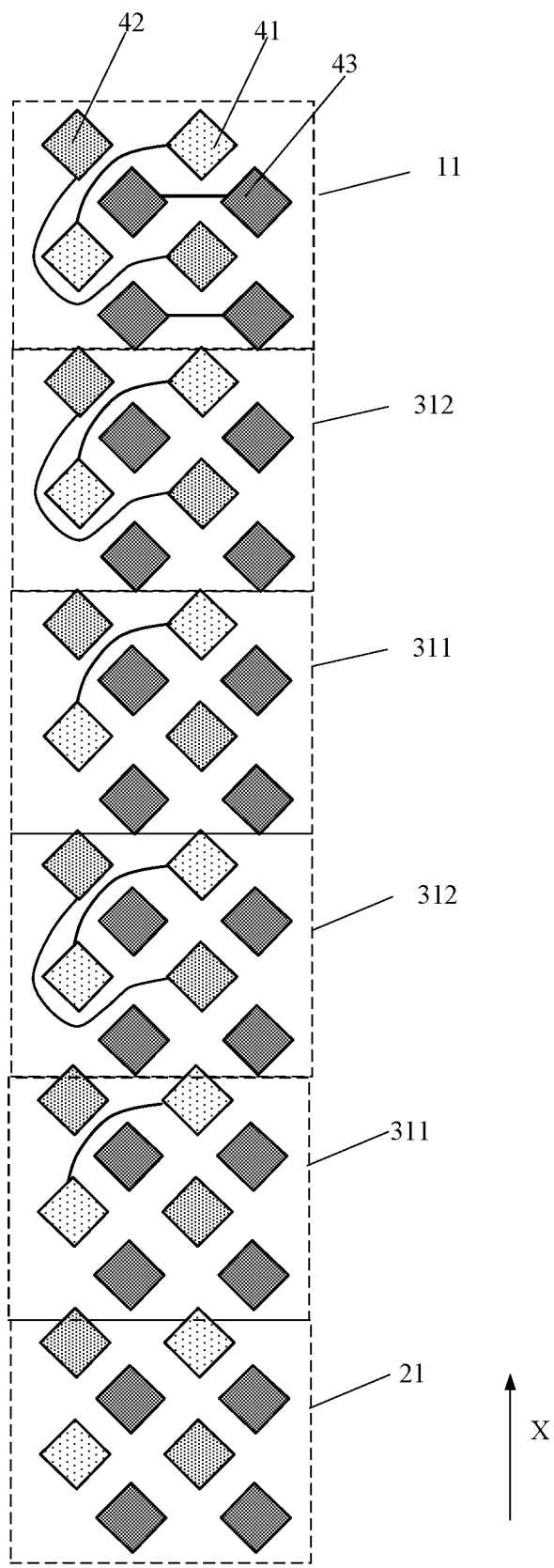
FIG. 31 illustrates a schematic diagram of a first sub-display area, a transition display area, and a second sub-display area in a display panel provided by another embodiment of the present disclosure.

It should be noted that, the above embodiments are all illustrated by taking an example that the sub-transition area includes a first sub-transition area and a second sub-transition area, which is not limited herein. In other embodiments, the sub-transition area may further include a plurality of first sub-transition areas and a plurality of second sub-transition areas. When the sub-transition area includes a plurality of first sub-transition areas and a plurality of second sub-transition areas, in one embodiment, as shown in FIG. 30, in a first direction, a plurality of first sub-transition areas is disposed adjacently, and a plurality of second sub-transition areas is disposed adjacently. In another embodiment, as shown in FIG. 31, in the first direction, a plurality of first sub-transition areas and a plurality of second sub-transition areas are disposed at intervals.

Figure 32:
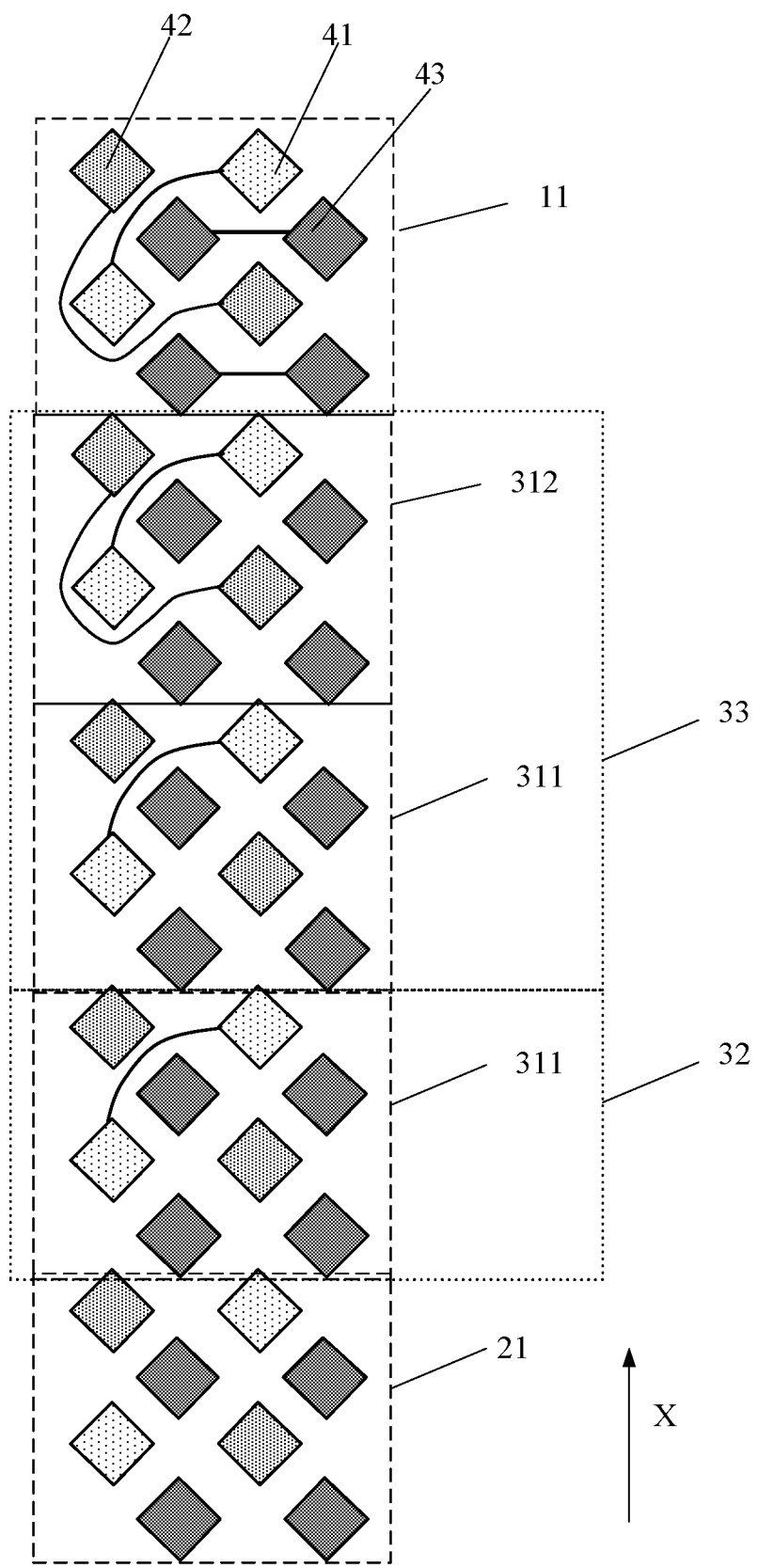
FIG. 32 illustrates a schematic diagram of a first sub-display area, a transition display area, and a second sub-display area in a display panel provided by another embodiment of the present disclosure.

As shown in FIG. 32, the transition display area includes a first transition display area 32 and a second transition display area 33. The second transition display area 33 is on a side of the first transition display area 32 close to the first display area, that is, the second transition display area 33 is on a side of the first transition display area 32 close to the first sub-display area 11. The first transition display area 32 includes the first sub-transition area 311, and the second transition display area 33 includes the first sub-transition area 311 and the second sub-transition area 312.

It should be noted that, in the above embodiment, FIG. 32 takes the transition display area including a first transition display area and a second transition display area as an example for illustration, which is not limited herein. In other embodiments, the transition display area may further include at least two first transition display areas and/or at least two second transition display areas, depending on a specific situation.

When the transition display area may further include at least two first transition display areas and/or at least two second transition display areas. The at least two first transition display areas are disposed adjacently, and the at least two second transition display areas are disposed adjacently, which is not limited herein and depends on a specific situation.

Figure 33:
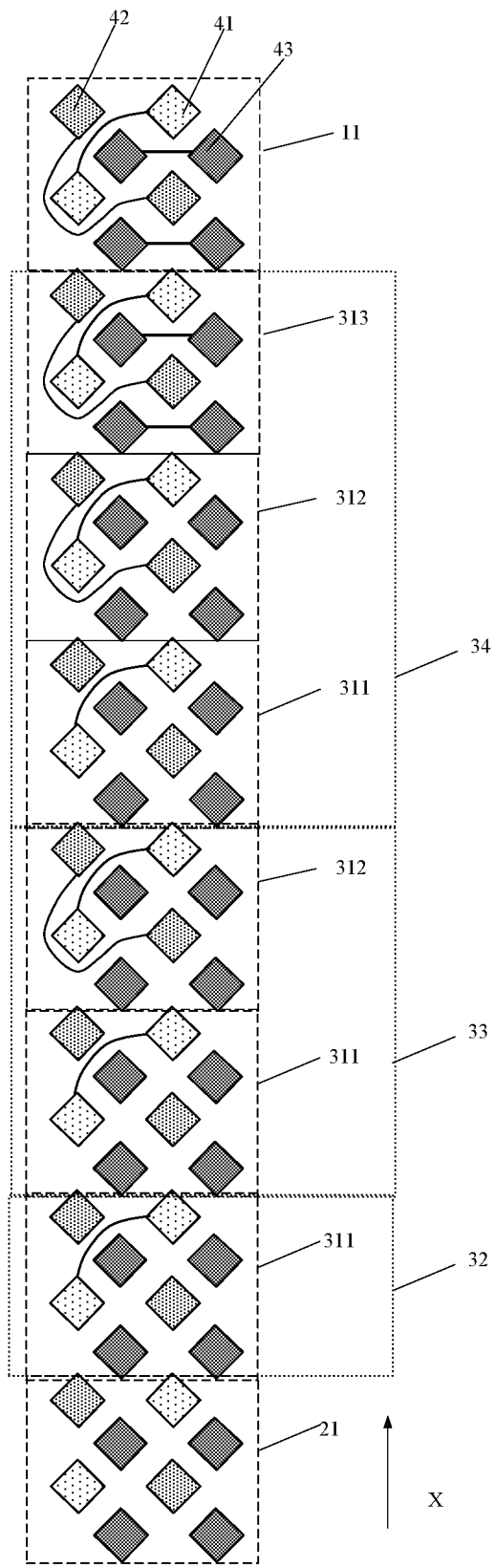
FIG. 33 illustrates a schematic diagram of a first sub-display area, a transition display area, and a second sub-display area in a display panel provided by another embodiment of the present disclosure.

In another embodiment, as shown in FIG. 33, the transition display area further includes a sub-non-transition display area 313. A driving relationship between the light-emitting elements and the pixel circuits thereof in the sub-non-transition display area 313 is same as a driving relationship between the light-emitting elements and the pixel circuits thereof in the first sub-display area 11. Optionally, in the embodiment, the transition display area further includes a third transition display area 34 on a side of the second transition display area 33 close to the first display area. That is, the third transition display area 34 is on a side of the second transition display area 33 close to the first sub-display area 11. The third transition display area 34 includes the first sub-transition area 311, the second sub-transition area 312 and a sub-non-transition area 313.

It should be noted that driving relationships between the light-emitting elements and pixel circuits thereof in the sub-non-transition display area being same as driving relationships between the first light-emitting elements and corresponding pixel circuits thereof in the first sub-display area includes: a driving relationship between the first light-emitting elements and corresponding pixel circuits thereof in the sub-non-transition area being same as a driving relationship between the first light-emitting elements and corresponding pixel circuits thereof in the first sub-display area, a driving relationship between the second light-emitting elements and corresponding pixel circuits thereof in the sub-non-transition area being same as a driving relationship between the second light-emitting elements and corresponding pixel circuits thereof in the first sub-display area, and a driving relationship between the third light-emitting elements and corresponding pixel circuits thereof in the sub-non-transition area being same as a driving relationship between the third light-emitting elements and corresponding pixel circuits thereof in the first sub-display area.

Specifically, in one embodiment, in the first display area, each of pixel circuits for driving the red light-emitting elements drives two red light-emitting elements, each of pixel circuits for driving the blue light-emitting elements drives two blue light-emitting elements and each of pixel circuit for driving the green light-emitting elements drives two green light-emitting elements. In the sub-non-transition area, each of pixel circuits for driving the red light-emitting elements drives two red light-emitting elements, each of pixel circuits for driving the blue light-emitting elements drives two blue light-emitting elements and each of pixel circuit for driving the green light-emitting elements drives two green light-emitting elements.

It should also be noted that, in the above embodiment, FIG. 33 takes the transition display area including a first transition display area, a second transition display area and a third transition display area as an example for illustration, which is not limited herein. In other embodiments of the present disclosure, the transition display area may further include at least two first transition display areas and/or at least two second transition display areas and/or at least two third transition display areas, depending on a specific situation.

When the transition display area may further include at least two first transition display areas, the first transition display areas are disposed adjacent to each other; when the transition display area includes at least two second transition display areas, the second transition display areas are disposed adjacent to each other; when the transition display area includes at least two third transition display areas, the third transition display areas are disposed adjacent to each other, which is not limited herein and depends on a specific situation.

As shown in FIG. 33, in the third transition display area 34, along a first direction X, the first sub-transition area 311, the second sub-transition area 312 and the sub-non-transition area 313 are disposed in sequence. The first direction X is a direction in which the second display area points to the first display area.

Figure 34:
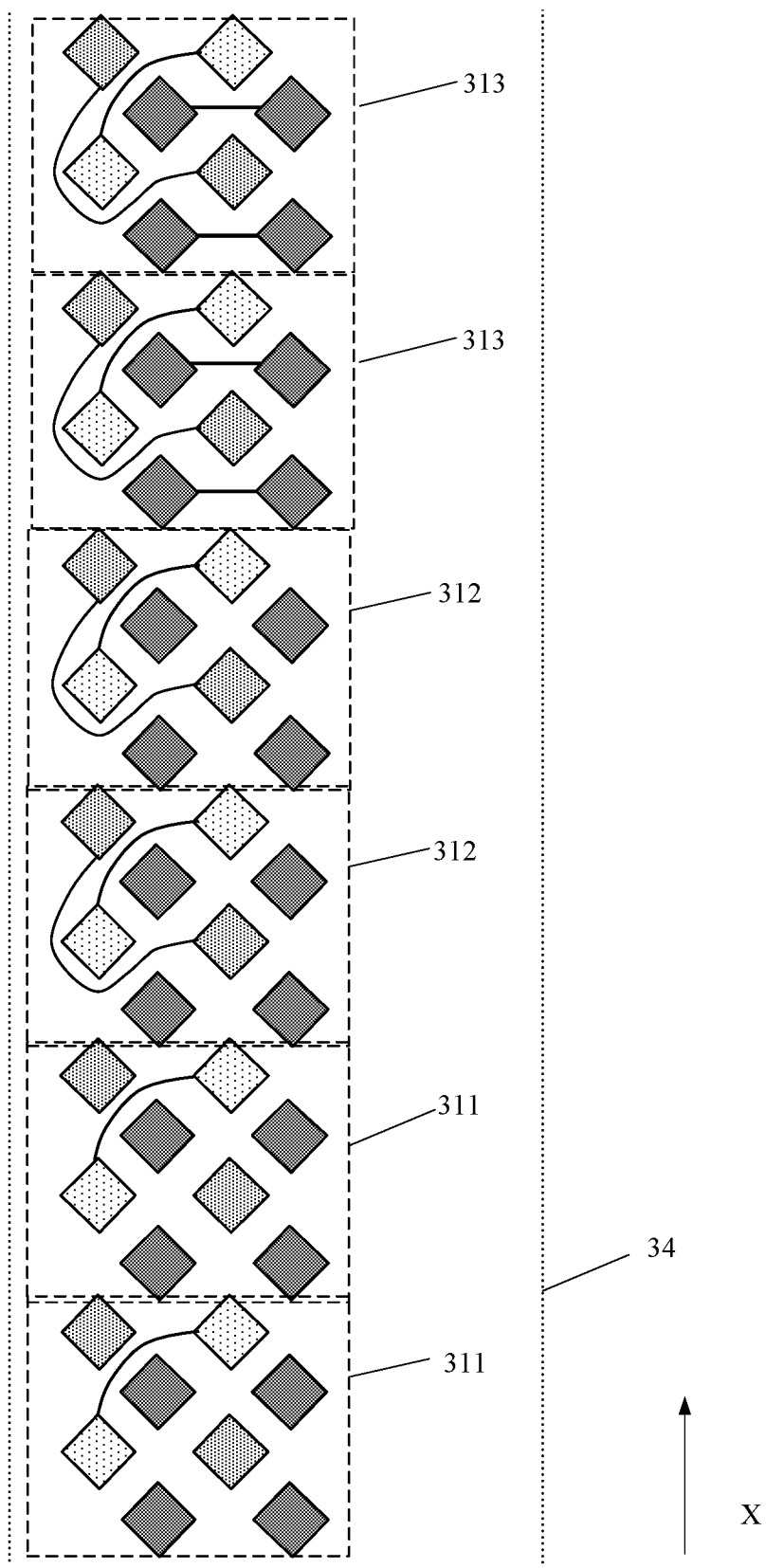
FIG. 34 illustrates a schematic diagram of a first sub-display area, a transition display area, and a second sub-display area in a display panel provided by another embodiment of the present disclosure.

It should be noted that, in the above embodiment, as shown in FIG. 33, the third transition display area may include a first sub-transition area, a second sub-transition area and a sub-non-transition area. As shown in FIG. 34, the third transition display area may further include two first transition areas, two second sub-transition areas and two sub-non-transition areas. The third transition display area may include another number of first sub-transition areas, another number of second sub-transition areas, and another number of sub-non-transition areas, which is not limited herein and depends on a specific situation. Optionally, when the third transition area includes at least two first sub-transition areas, the at least two first sub-transition areas are disposed adjacently; when the third transition area includes at least two second sub-transition areas, the at least two second sub-transition areas are disposed adjacently; and when the third transition area includes at least two sub-non-transition areas, the at least two sub-non-transition areas are disposed adjacently, which is not limited herein and depends on a specific situation.

Similarly, the second transition display area may include a first sub-transition area and a second sub-transition area or may include at least two first sub-transition areas and at least two second sub-transition areas or may include another number of first transition areas and another number of second sub-transition areas, which is not limited herein and depends on a specific situation. Optionally, when the second transition area includes at least two first sub-transition areas, the at least two first sub-transition areas are disposed adjacently; when the second transition area includes at least two second sub-transition areas, the at least two second sub-transition areas are disposed adjacently, which is not limited herein, and depends on a specific situation.

Along a second direction, the first light-emitting elements, the second light-emitting elements and the third light-emitting elements are selected in a same manner as transition light-emitting elements and non-transition light-emitting elements in at least two adjacent sub-transition areas. The second direction is perpendicular to a direction in which the second display area points to the first display area.

Figure 35:
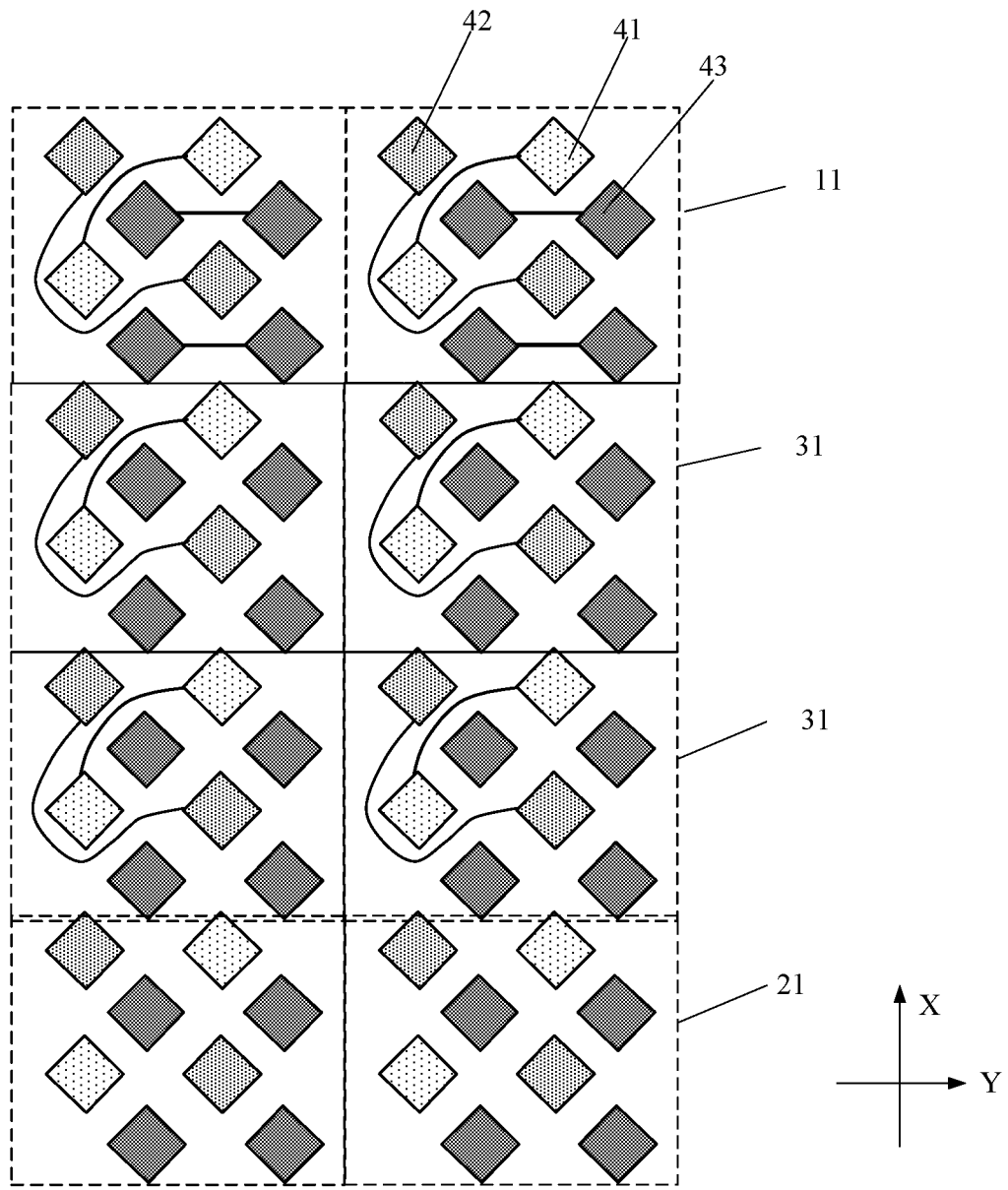
FIG. 35 illustrates a schematic diagram of a first sub-display area, a transition display area, and a second sub-display area in a display panel provided by another embodiment of the present disclosure.

As shown in FIG. 35, along the second direction Y, in at least two adjacent sub-transition areas 31, the transition light-emitting elements are the first light-emitting elements and the second light-emitting elements, and the non-transition light-emitting elements are the first light-emitting elements and the second light-emitting elements. That is, in at least two adjacent sub-transition areas 31, along the second direction Y, the transition light-emitting elements are all the blue light-emitting elements 41 and the red light-emitting elements 42, and the non-transition light-emitting elements are all the green light-emitting elements 43. In other embodiments, along the second direction, in at least two adjacent sub-transition areas, the transition light-emitting elements are all the first light-emitting elements and the third light-emitting elements, and the non-transition light-emitting elements are all the second light-emitting element; or, along the second direction, in at least two adjacent sub-transition areas, the transition light-emitting elements are all the first light-emitting element, and the non-transition light-emitting elements are all the second light-emitting elements and the third light-emitting elements, depending on a specific situation.

In another embodiment, in a second direction, in at least two adjacent sub-transition areas, the first light-emitting elements, the second light-emitting elements and the third light-emitting elements are selected in a different manner as transition light-emitting elements and non-transition light-emitting elements. The second direction is perpendicular to a direction in which the second display area points to the first display area.

In the first direction, in at least two adjacent sub-transition areas, the first light-emitting elements, the second light-emitting elements and the third light-emitting elements are selected in a same manner as transition light-emitting elements and non-transition light-emitting elements. In the second direction, in at least two adjacent sub-transition areas, the first light-emitting elements, the second light-emitting elements and the third light-emitting elements are selected in a different manner as transition light-emitting elements and non-transition light-emitting elements. The first direction is a direction in which the second display area points to the first display area, and the second direction is perpendicular to a direction in which the second display area points to the first display area.

Figure 36:
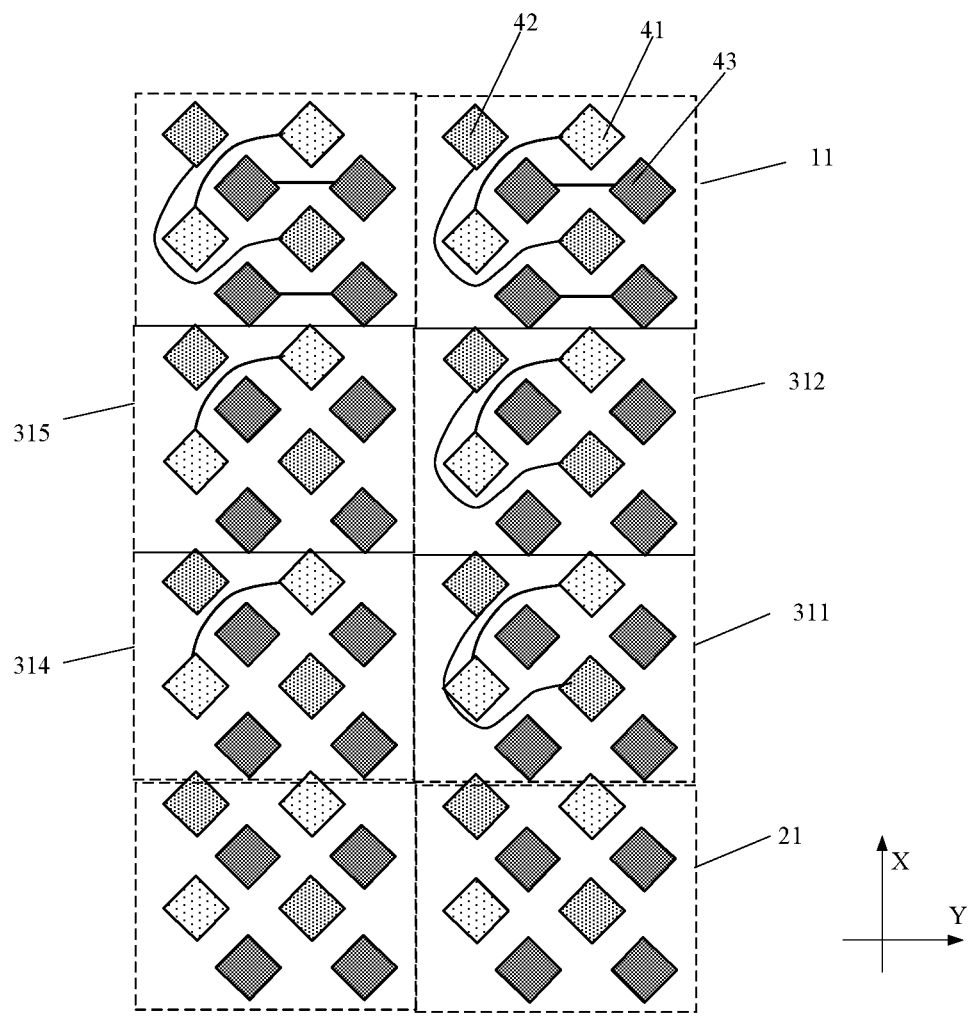
FIG. 36 illustrates a schematic diagram of a first sub-display area, a transition display area, and a second sub-display area in a display panel provided by another embodiment of the present disclosure.

Specifically, in one embodiment, the at least two sub-transition areas include a fourth sub-transition area and a fifth sub-transition area. As shown in FIG. 36, the transition display area further includes a fourth sub-transition area 314 and a fifth sub-transition area 315. The fourth sub-transition area 314 and the first sub-transition area 311 are disposed along a second direction Y, and the fifth sub-transition area 315 and the second sub-transition area 312 are disposed along the second direction Y. In the first sub-transition area and the second sub-transition area, the first light-emitting elements, the second light-emitting elements and the third light-emitting elements are selected in a same manner as transition light-emitting elements and non-transition light-emitting elements. In the fourth sub-transition area and the fifth sub-transition area, the first light-emitting elements, the second light-emitting elements and the third light-emitting elements are selected in a same manner as transition light-emitting elements and non-transition light-emitting elements. In the first sub-transition area and the fourth sub-transition area, the first light-emitting elements, the second light-emitting elements and the third light-emitting elements are selected in a different manner as transition light-emitting elements and non-transition light-emitting elements.

In another embodiment, in at least two adjacent sub-transition areas, the first light-emitting elements, the second light-emitting elements and the third light-emitting elements are selected in a same manner as transition light-emitting elements and non-transition light-emitting elements. In the second direction, in at least two adjacent sub-transition areas, the first light-emitting elements, the second light-emitting elements and the third light-emitting elements are selected in a different manner for transition light-emitting elements and non-transition light-emitting elements. The first direction is a direction in which the second display area points to the first display area, and the second direction is perpendicular to the direction in which the second display area points to the first display area.

Figure 37:
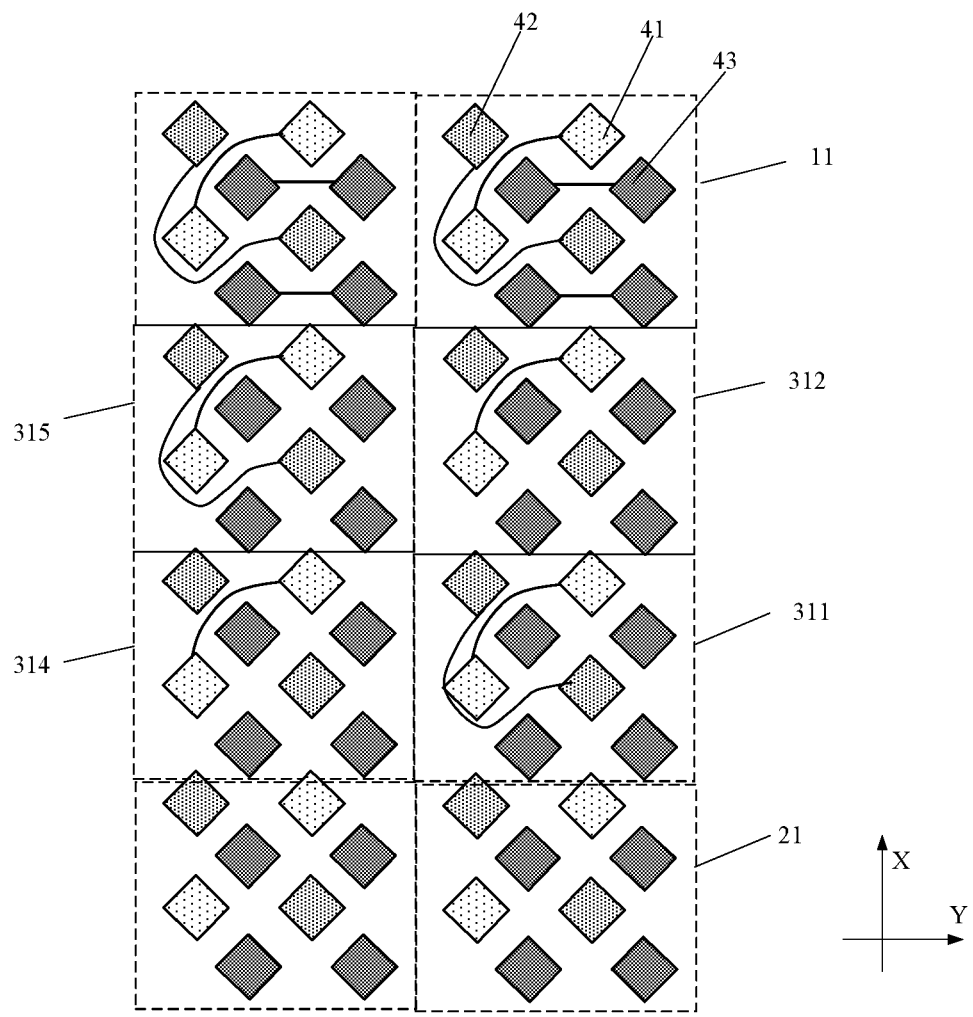
FIG. 37 illustrates a schematic diagram of a first sub-display area, a transition display area, and a second sub-display area in a display panel provided by another embodiment of the present disclosure.

Specifically, in one embodiment, the at least two sub-transition areas include a fourth sub-transition area and a fifth sub-transition area. As shown in FIG. 37, the transition display area further includes a fourth sub-transition area 314 and a fifth sub-transition area 315. The fourth sub-transition area 314 and the first sub-transition area 311 are disposed along a second direction Y, and the fifth sub-transition area 315 and the second sub-transition area 312 are disposed along the second direction Y. In the first sub-transition area and the second sub-transition area, the first light-emitting elements, the second light-emitting elements and the third light-emitting elements are selected in a different manner as transition light-emitting elements and non-transition light-emitting elements. In the fourth sub-transition area and the fifth sub-transition area, the first light-emitting elements, the second light-emitting elements and the third light-emitting elements are selected in a different manner as transition light-emitting elements and non-transition light-emitting elements. In the first sub-transition area and the fourth sub-transition area, the first light-emitting elements, the second light-emitting elements and the third light-emitting elements are selected in a different manner for transition light-emitting elements and non-transition light-emitting elements.

The display panel provided by the embodiments of the present disclosure will be described below by taking an example that the first light-emitting elements, the second light-emitting elements and the third light-emitting elements are selected in a same manner as transition light-emitting elements and non-transition light-emitting elements in at least two adjacent sub-transition areas, and the first light-emitting elements, the second light-emitting elements and the third light-emitting elements are selected in a same manner as transition light-emitting elements and non-transition light-emitting elements in at least two adjacent sub-transition areas.

Specifically, in one embodiment, as shown in FIG. 36, the fourth sub-transition area 314 includes one transition light-emitting element and two non-transition light-emitting elements. The first sub-transition area 311 includes two transition light-emitting elements and one non-transition light-emitting element. The fifth sub-transition area 315 includes one transition light-emitting elements and two non-transition light-emitting elements, The second transition area 312 includes two transition light-emitting elements and one non-transition light-emitting element.

As shown in FIG. 36, in the fourth sub-transition area 314 and the fifth sub-transition area 315, the transition light-emitting elements are the first light-emitting elements, and the non-transition light-emitting elements are the second light-emitting elements and the third light-emitting elements. That is, in the fourth sub-transition area 314 and the fifth sub-transition area 315, the transition light-emitting elements are the blue light-emitting elements 41 and the non-transition light-emitting elements are the red light-emitting elements 42 and the green light-emitting elements 43. In the first sub-transition area 311 and the second sub-transition area 312, the transition light-emitting elements are the first light-emitting elements and the second light-emitting elements, the non-transition light-emitting elements are the third light-emitting elements. That is, in the first sub-transition area 311 and the second sub-transition area 312, the transition light-emitting elements are the blue light-emitting elements 41 and the red light-emitting elements 42, and the non-transition light-emitting elements are the green light-emitting elements 43.

Figure 38:
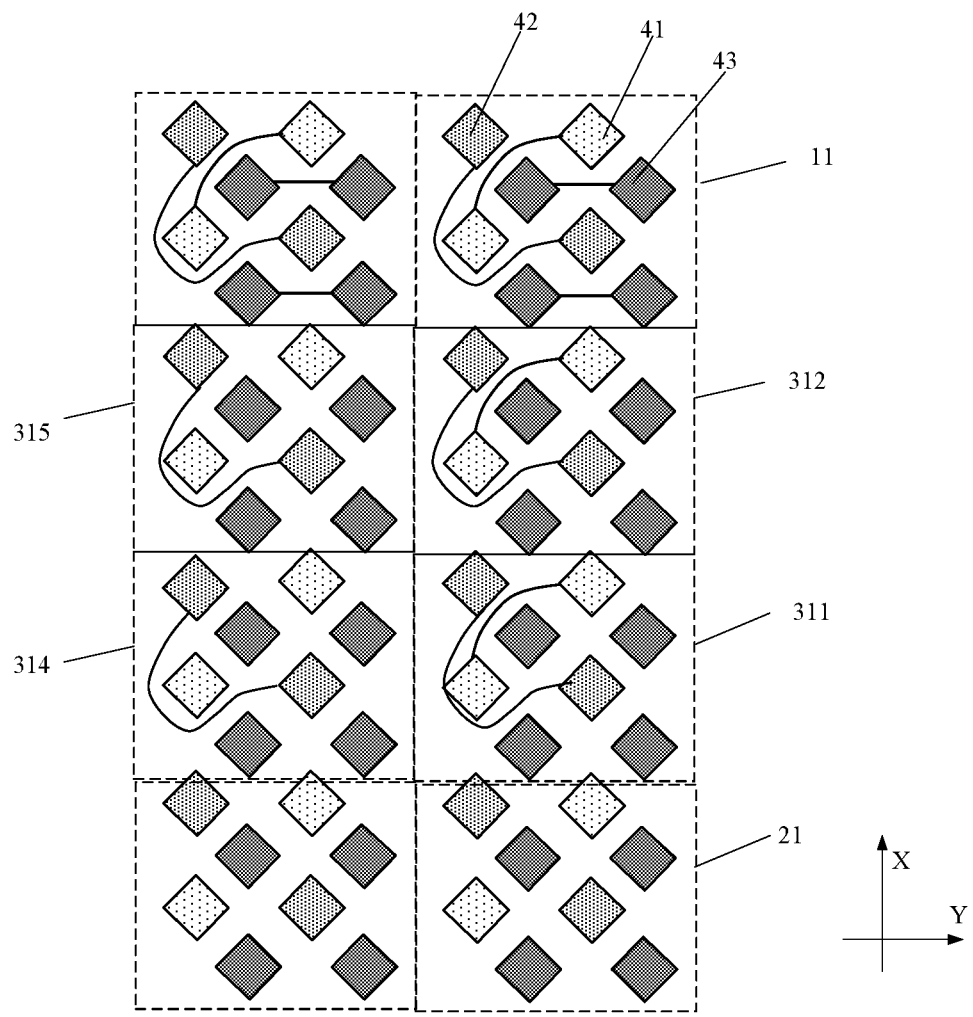
FIG. 38 illustrates a schematic diagram of a first sub-display area, a transition display area, and a second sub-display area in a display panel provided by another embodiment of the present disclosure.

In another embodiment, as shown in FIG. 38, in the fourth sub-transition area 314 and the fifth sub-transition area 315, the transition light-emitting elements are the second light-emitting elements, and the non-transition light-emitting elements are the first light-emitting elements and the third light-emitting elements. That is, in the fourth sub-transition area 314 and the fifth sub-transition area 315, the transition light-emitting elements are the red light-emitting elements 42, and the non-transition light-emitting elements are the blue light-emitting elements 41 and the green light-emitting elements 43. In the first sub-transition area 311 and the second sub-transition area 312, the transition light-emitting elements are the first light-emitting element and the second light-emitting element, the non-transition light-emitting elements are the third light-emitting elements. That is, in the first sub-transition area 311 and the second sub-transition area 312, the transition light-emitting elements are the blue light-emitting elements 41 and the red light-emitting elements 42, and the non-transition light-emitting elements are the green light-emitting elements 43.

Figure 39:
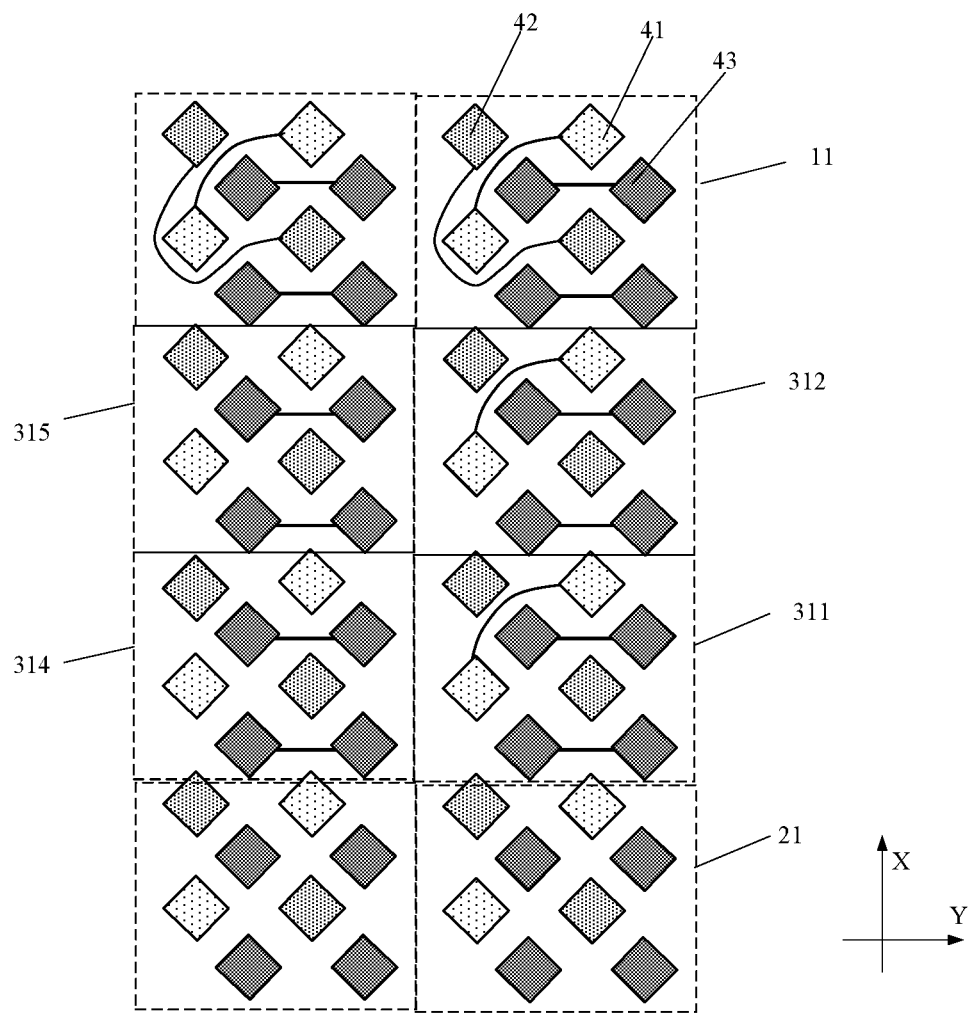
FIG. 39 illustrates a schematic diagram of a first sub-display area, a transition display area, and a second sub-display area in a display panel provided by another embodiment of the present disclosure.

In another embodiment, as shown in FIG. 39, in the fourth sub-transition area 314 and the fifth sub-transition area 315, the transition light-emitting elements are the third light-emitting elements, and the non-transition light-emitting elements are the first light-emitting elements and the second light-emitting elements. That is, in the fourth sub-transition area 314 and the fifth sub-transition area 315, the transition light-emitting elements are the green light-emitting elements 43, and the non-transition light-emitting elements are the blue light-emitting elements 41 and the red light-emitting elements 42. In the first sub-transition area 311 and the second sub-transition area 312, the transition light-emitting elements are the first light-emitting elements and the third light-emitting elements, and the non-transition light-emitting element are the second light-emitting elements. That is, in the first sub-transition area 311 and the second sub-transition area 312, the transition light-emitting elements are the blue light-emitting element 41 and the green light-emitting element 43, and the non-transition light-emitting elements are the red light-emitting elements 42.

Figure 40:
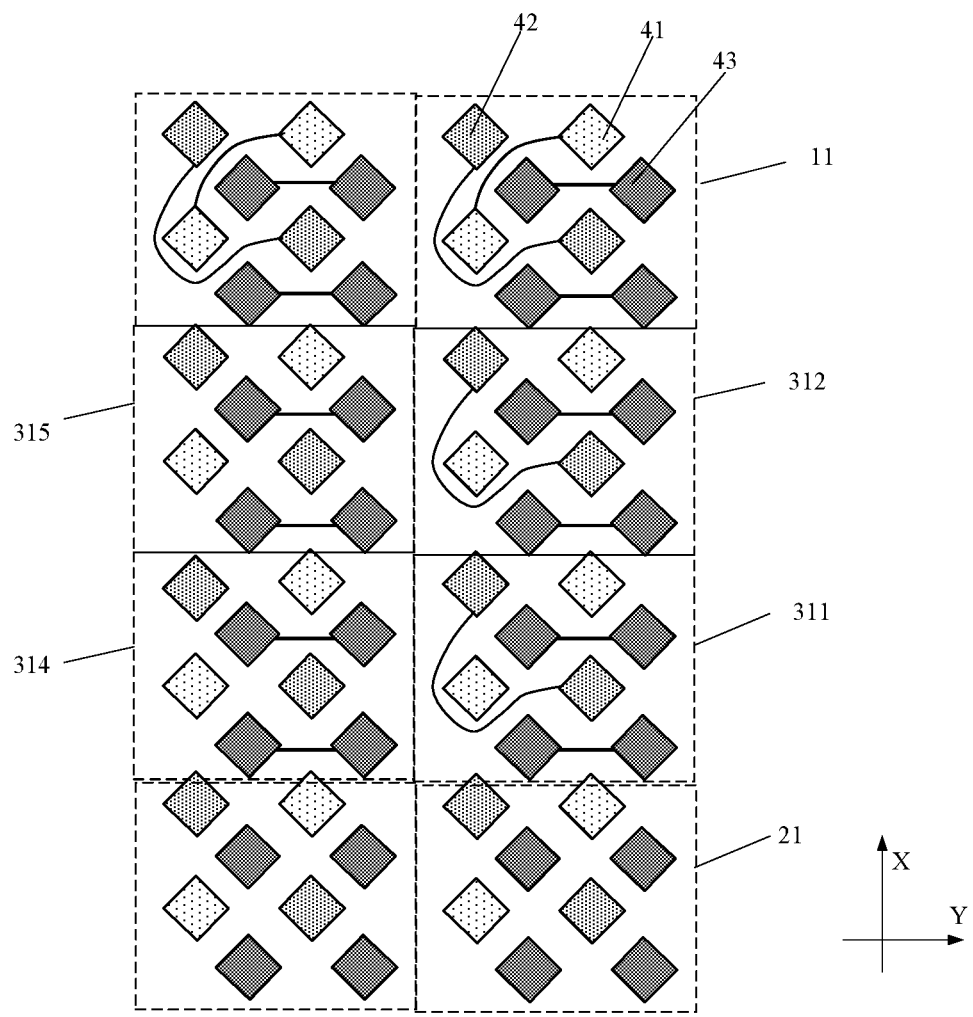
FIG. 40 illustrates a schematic diagram of a first sub-display area, a transition display area, and a second sub-display area in a display panel provided by another embodiment of the present disclosure.

In another embodiment, as shown in FIG. 40, in the fourth sub-transition area 314 and the fifth sub-transition area 315, the transition light-emitting elements are the third light-emitting elements, and the non-transition light-emitting elements are the first light-emitting elements and the second light-emitting elements. That is, in the fourth sub-transition area 314 and the fifth sub-transition area 315, the transition light-emitting elements are the green light-emitting elements 43, and the non-transition light-emitting elements are the blue light-emitting elements 41 and the red light-emitting elements 42. In the first sub-transition area 311 and the second sub-transition area 312, the transition light-emitting elements are the second light-emitting elements and the third light-emitting elements, and the non-transition light-emitting elements are the first light-emitting elements. That is, in the first sub-transition area 311 and the second sub-transition area 312, the transition light-emitting elements are the red light-emitting elements 42 and the green light-emitting elements 43, and the non-transition light-emitting elements are the blue light-emitting elements 41.

Figure 41:
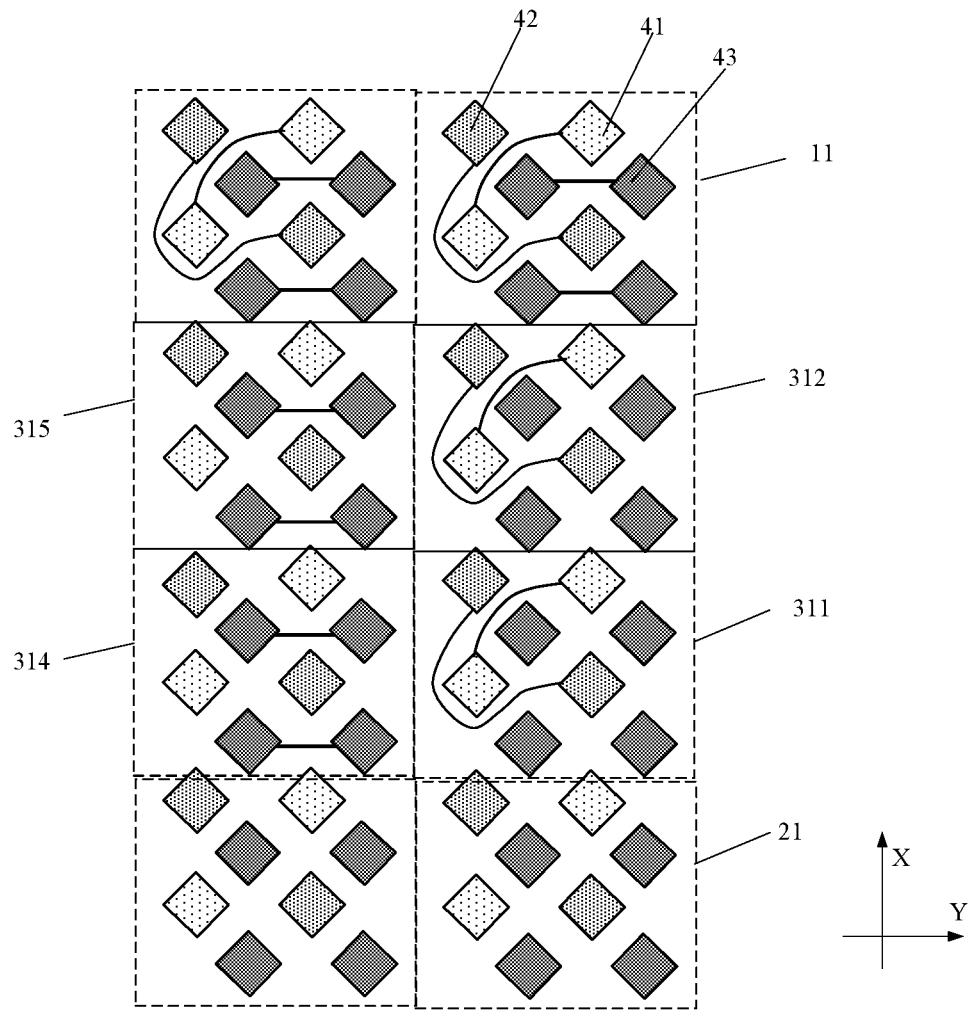
FIG. 41 illustrates a schematic diagram of a first sub-display area, a transition display area, and a second sub-display area in a display panel provided by another embodiment of the present disclosure.

In another embodiment, as shown in FIG. 41, in the fourth sub-transition area 314 and the fifth sub-transition area 315, the transition light-emitting elements are the third light-emitting elements, and the non-transition light-emitting elements are the first light-emitting elements and the second light-emitting elements. That is, in the fourth sub-transition area 314 and the fifth sub-transition area 315, the transition light-emitting elements are green light-emitting elements 43, and the non-transition light-emitting elements are the blue light-emitting elements 41 and the red light-emitting elements 42. In the first sub-transition area 311 and the second sub-transition area 312, the transition light-emitting elements are the first light-emitting element and the second light-emitting element, and the non-transition light-emitting elements are the third light-emitting elements. That is, in the first sub-transition area 311 and the second sub-transition area 312, the transition light-emitting elements are the blue light-emitting elements 41 and the red light-emitting elements 42, and the non-transition light-emitting elements are the green light-emitting elements 43.

As shown in FIGS. 36-40, in one embodiment, one of two types of transition light-emitting elements in the first sub-transition area is same as the transition light-emitting elements in the fourth sub-transition area, which is not limited herein. In other embodiments, as shown in FIG. 41, the two types of transition light-emitting elements in the first sub-transition area and the transition light-emitting elements in the fourth sub-transition area may also be different, depending on a specific situation.

In addition, one embodiment further provides a display device, where the display device includes the display panel provided by any of the above embodiments. Optionally, the display device may be one of various electronic devices with a display function, such as a mobile phone, a tablet computer, or the like.

Specifically, based on the above embodiment, in one embodiment, the display device further includes an optical sensor, which overlaps the first display area of the display panel, so that the optical sensor can collect light based on light input from the first display area.

Figure 42:
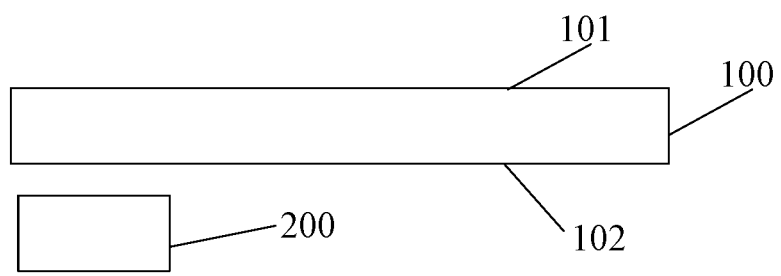
FIG. 42 illustrates a schematic diagram of a display device provided by an embodiment of the present disclosure.

Optionally, in one embodiment, light collected by an optical sensor is used for image collection. For example, the optical sensor includes a camera, and the display device is a display device with a camera. Specifically, as shown in FIG. 42, an optical sensor 200 may be on the non-display side 102 of a display panel 100. The non-display side 102 of the display panel is opposite to of the display panel.

In another embodiment, light collected by an optical sensor is used for fingerprint identification. For example, the optical sensor includes a fingerprint identification module, and the display device is a display device with a fingerprint identification function, which is not limited herein and depends on a specific situation.

As such, in the display panel and the display device provided by the embodiments of the present disclosure, the first sub-display area, the second sub-display area, and the sub-transition display area include a same number of light-emitting elements. Number of pixel circuits for driving each light-emitting element in one of the sub-transition areas is greater than number of pixel circuits for driving each light-emitting elements in one of the first sub-display areas and is smaller than number of pixel circuits for driving each light-emitting element in one of the second sub-display areas. Therefore, number of pixel circuits for driving each light-emitting element in one of the sub-transition areas is between number of pixel circuits for driving each light-emitting element in the first sub-display area and number of pixel circuits for driving each light-emitting element in the second sub-display area. When the display panel is displaying a picture, a display effect of the sub-transition area is between a display effect of the first sub-display area and a display effect of the second sub-display area, that is, a display effect of the transition display area is between a display effect of the first display area and a display effect of the second display area. The display effect of the transition display area is used to realize a transition between the display effect of the first display area and the display effect of the second display area, to reduce a display difference when a user watches a display screen and improve a user's experience.

In the present specification, each embodiment is described in a progressive manner, or in parallel or in a combination of thereof. Each embodiment focuses on differences from other embodiments, so same and similar parts between various embodiments can be referred to each other. Since the device disclosed in the embodiments corresponds to the method disclosed in the embodiments, the description is relatively simple, and relevant parts can be referred to the description of the method.

It should be noted that, in the description of the present disclosure, an orientation or a positional relationship indicated by the terms "upper", "lower", "top", "bottom", "inner", "outer", etc. is based on the orientation or positional relationship shown in the accompanying drawings, and is only for the convenience of describing the present application and simplified description, rather than indicating or implying that the device or element referred to must have a particular orientation, be constructed and operate in a particular orientation, and therefore should not be construed as limiting the present disclosure. When a component is said to be "connected" to another component, the component can be directly connected to the other component or there may be a centered component at a same time.

It needs to note that in the specification, relationship terms such as first and second are just used to distinguish one entity or operation from another entity or operation but does not necessarily require or suggest that any such actual relationship or sequence exists among these entities or operations. Furthermore, terms of "including", "comprising" or any other variants intend to cover non-exclusive containing, so that an object or a device containing a series of elements not only comprise those elements, but also comprise other elements not listed explicitly, or further comprise elements inherent to such object or device. In the case of no further limitation, an element defined by an expression of "comprising one . . . " does not exclude that there exists additional same element in the process, method, objects, or device comprising the element.

The above description of the disclosed embodiments is provided to enable a person skilled in the art to make or use the present disclosure. Various modifications to the embodiments will be readily apparent to a person skilled in the art, and the generic principles defined herein may be applied to other embodiments without departing from the spirit or scope of the disclosure. Therefore, the present disclosure is not intended to be limited to the embodiments shown herein but is to be accorded the widest scope consistent with the principles and novel features disclosed herein.

What is claimed is:

1. A display panel, comprising a first display area, a second display area, and a transition display area between the first display area and the second display area, wherein:
   the first display area includes a plurality of first sub-display areas, the second display area includes a plurality of second sub-display areas, and the transition display area includes at least one sub-transition area;
   a first sub-display area of the plurality of first sub-display areas, a second sub-display area of the plurality of second sub-display areas and a sub-transition area each consists of two blue light-emitting elements, two red light-emitting elements, and four green light-emitting elements; and
   number of pixel circuits for driving each light-emitting element in one of the at least one sub-transition area is greater than number of pixel circuits for driving each light-emitting element in one of the plurality of first sub-display areas and is smaller than number of pixel circuits for driving each light-emitting element in one of the plurality of second sub-display areas, wherein light-emitting elements in the first display area are driven by pixel circuits in the first display area, wherein:
     in the second sub-display area, one pixel circuit is electrically connected exclusively to one light-emitting element of a same color;
     the light-emitting elements include first light-emitting elements, second light-emitting elements and third light-emitting elements;
     the sub-transition area includes at least one type of transition light-emitting elements and at least one type of non-transition light-emitting elements, the transition light-emitting elements selected from one or two types of the first light-emitting elements, the second light-emitting elements and the third light-emitting elements, and the rest types of light-emitting elements are non-transition light-emitting elements;
     an arrangement of the transition light-emitting elements includes: number of transition light-emitting elements in the sub-transition area driven by one pixel circuit is equal to number of transition light-emitting elements in the first sub-display area driven by one pixel circuit, and is greater than number of transition light-emitting elements in the second sub-display area driven by one pixel circuit; and
     an arrangement of the non-transition light-emitting elements includes: number of non-transition light-emitting elements in the sub-transition area driven by one pixel circuit is smaller than number of non-transition light-emitting elements in the first sub-display area driven by one pixel circuit and is equal to number of non-transition light-emitting elements in the second sub-display area driven by one pixel circuit.

2. The display panel according to claim 1, wherein the first display area includes a light-transmitting area.

3. The display panel according to claim 1, wherein:
   the first light-emitting elements are blue light-emitting elements, the second light-emitting elements are red light-emitting elements, and the third light-emitting elements are green light-emitting elements; and
   at least the first light-emitting elements are selected as the transition light-emitting elements.

4. The display panel according to claim 1, wherein:
   the first light-emitting elements are blue light-emitting elements, the second light-emitting elements are red light-emitting elements, and the third light-emitting elements are green light-emitting elements;
   when the first light-emitting elements are selected as the transition light-emitting elements, one pixel circuit drives two first light-emitting elements in the sub-transition area;
   when the second light-emitting elements are selected as the transition light-emitting elements, one pixel circuit drives two second light-emitting elements in the sub-transition area; and
   when the third light-emitting elements are selected as the transition light-emitting elements, one pixel circuit drives two third light-emitting elements, or one pixel circuit drives four third light-emitting elements in the sub-transition area.

5. The display panel according to claim 1, wherein:
   along a first direction, at least two sub-transition areas are disposed adjacent to each other; and
   the first direction is a direction in which the second display area points to the first display area.

6. The display panel according to claim 5, wherein:
   along the first direction, the first light-emitting elements, the second light-emitting elements and the third light-emitting elements are selected in a same manner for transition light-emitting elements and non-transition light-emitting elements in the at least two adjacent sub-transition areas; and
   the first direction is the direction in which the second display area points to the first display area.

7. The display panel according to claim 1, wherein:
   the sub-transition area includes a first sub-transition area and a second sub-transition area, the first sub-transition area includes one type of transition light-emitting elements and two types of non-transition light-emitting elements, and the second sub-transition area includes two types of transition light-emitting elements and one type of non-transition light-emitting elements.

8. The display panel according to claim 7, wherein:
the second sub-transition area is on a side of the first sub-transition area close to the first display area.

9. The display panel according to claim 7, wherein:
one of two types of transition light-emitting elements in the second sub-transition area is same as a type of transition light-emitting elements in the first sub-transition area.

10. The display panel according to claim 7, wherein:
the transition display area includes a first transition display area and a second transition display area, the second transition display area is on a side of the first transition display area close to the first display area, the first transition display area includes the first sub-transition area, and the second transition display area includes the first sub-transition area and the second sub-transition area.

11. The display panel according to claim 10, wherein:
the transition display area further includes a sub-non-transition area, and a driving relationship between the light-emitting elements and the pixel circuits in the sub-non-transition area is same as a driving relationship between the light-emitting elements and the pixel circuits in the first sub-display area; and
the transition display area further includes a third transition display area, the third transition display area is on a side of the second transition display area close to the first display area, and the third transition display area includes the first sub-transition area, the second sub-transition area, and the sub-non-transition area.

12. The display panel according to claim 11, wherein:
in the third transition display area, along a first direction, the first sub-transition area, the second sub-transition area and the sub-non-transition area are disposed in sequence; and
the first direction is a direction in which the second display area points to the first display area.

13. The display panel according to claim 1, wherein:
in a second direction, the first light-emitting elements, the second light-emitting elements and the third light-emitting elements are selected in a same manner for transition light-emitting elements and non-transition light-emitting elements in at least two adjacent sub-transition areas; and
the second direction is perpendicular to a direction in which the second display area points to the first display area.

14. The display panel according to claim 1, wherein:
in the second direction, the first light-emitting elements, the second light-emitting elements and the third light-emitting elements are selected in a different manner for transition light-emitting elements and non-transition light-emitting elements in at least two adjacent sub-transition areas; and
the second direction is perpendicular to a direction in which the second display area points to the first display area.

15. The display panel according to claim 1, wherein:
in the first sub-display area, one pixel circuit drives two light-emitting element; and
in the second sub-display area, one pixel circuit drives one light-emitting element.

16. A display device, comprising a display panel comprising a first display area, a second display area, and a transition display area between the first display area and the second display area, wherein:
the first display area includes a plurality of first sub-display areas, the second display area includes a plurality of second sub-display areas, and the transition display area includes at least one sub-transition area;
a first sub-display area of the plurality of first sub-display areas, a second sub-display area of the plurality of second sub-display areas and a sub-transition area each include consists of two blue light-emitting elements, two red light-emitting elements, and four green light-emitting elements; and
number of pixel circuits for driving each light-emitting element in one of the at least one sub-transition area is greater than number of pixel circuits for driving each light-emitting element in one of the plurality of first sub-display areas and is smaller than number of pixel circuits for driving each light-emitting element in one of the plurality of second sub-display areas, wherein light-emitting elements in the first display area are driven by pixel circuits in the first display area, wherein:
in the second sub-display area, one pixel circuit is electrically connected to one light-emitting element of a same color;
the light-emitting elements include first light-emitting elements, second light-emitting elements and third light-emitting elements;
the sub-transition area includes at least one type of transition light-emitting elements and at least one type of non-transition light-emitting elements, the transition light-emitting elements are selected from one or two types of the first light-emitting elements, the second light-emitting elements and the third light-emitting elements, and the rest types of light-emitting elements are non-transition light-emitting elements;
an arrangement of the transition light-emitting elements includes: number of transition light-emitting elements in the sub-transition area driven by one pixel circuit is equal to number of transition light-emitting elements in the first sub-display area driven by one pixel circuit, and is greater than number of transition light-emitting elements in the second sub-display area driven by one pixel circuit; and
an arrangement of the non-transition light-emitting elements includes: number of non-transition light-emitting elements in the sub-transition area driven by one pixel circuit is smaller than number of non-transition light-emitting elements in the first sub-display area driven by one pixel circuit and is equal to number of non-transition light-emitting elements in the second sub-display area driven by one pixel circuit.

17. The display device according to claim 16, comprising:
an optical sensor, overlapping the first display area of the display panel.

* * * * *